(12) United States Patent
Lee et al.

(10) Patent No.: US 7,981,745 B2
(45) Date of Patent: Jul. 19, 2011

(54) SACRIFICIAL NITRIDE AND GATE REPLACEMENT

(75) Inventors: Chungho Lee, Sunnyvale, CA (US);
Kuo-Tung Chang, Saratoga, CA (US);
Hiroyuki Kinoshita, San Jose, CA (US);
Huaqiang Wu, Mountain View, CA (US); Fred Cheung, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 817 days.

(21) Appl. No.: 11/847,507

(22) Filed: Aug. 30, 2007

(65) Prior Publication Data

US 2009/0061650 A1 Mar. 5, 2009

(51) Int. Cl.
*H01L 21/336* (2006.01)
(52) U.S. Cl. ............... 438/261; 438/257; 257/E21.21; 257/E21.309; 257/E21.421; 257/E21.431
(58) Field of Classification Search .......... 438/787, 438/257, 261; 257/324, E21.21, E21.309, 257/E21.423, E21.431
See application file for complete search history.

(56) References Cited

U.S. PATENT DOCUMENTS

| | | | | |
|---|---|---|---|---|
| 6,037,627 | A * | 3/2000 | Kitamura et al. ............ | 257/324 |
| 6,335,554 | B1 * | 1/2002 | Yoshikawa .................. | 257/316 |
| 6,639,271 | B1 * | 10/2003 | Zheng et al. ................ | 257/324 |
| 6,867,101 | B1 * | 3/2005 | Yu ................................ | 438/287 |
| 7,521,317 | B2 * | 4/2009 | Li et al. ....................... | 438/257 |
| 2005/0037577 | A1 * | 2/2005 | Kim et al. .................... | 438/260 |
| 2005/0148142 | A1 * | 7/2005 | Cabral et al. ................ | 438/280 |
| 2005/0255657 | A1 * | 11/2005 | Kim .............................. | 438/283 |
| 2005/0272198 | A1 | 12/2005 | Hamamura et al. | |
| 2006/0001075 | A1 * | 1/2006 | Shih ............................ | 257/315 |
| 2007/0048936 | A1 * | 3/2007 | Kim et al. .................... | 438/257 |
| 2007/0048957 | A1 * | 3/2007 | Lee et al. .................... | 438/324 |

FOREIGN PATENT DOCUMENTS

JP 08288412 A * 11/1996

OTHER PUBLICATIONS

International Search Report for International Application No. PCT/US2008/074291 dated Feb. 13, 2009.
Written Opinion of the International Searching Authority for PCT/US2008/074291 dated Feb. 13, 2009.
Partial International Search Report for PCT/US2008/074291 dated Oct. 7, 2008.

* cited by examiner

*Primary Examiner* — Thao X Le
*Assistant Examiner* — Eric W Jones
(74) *Attorney, Agent, or Firm* — Turocy & Watson, LLP

(57) ABSTRACT

Methods of forming a top oxide around a charge storage material layer of a memory cell and methods of improving quality of a top oxide around a charge storage material layer of a memory cell are provided. The method can involve providing a charge storage layer on a semiconductor substrate, a nitride layer on the charge storage layer, and a first poly layer on the nitride layer, and converting at least a portion of the nitride layer to a top oxide. By converting at least a portion of a nitride layer to a top oxide layer, the quality of the resultant top oxide layer can be improved.

18 Claims, 15 Drawing Sheets

US 7,981,745 B2

SACRIFICIAL NITRIDE AND GATE REPLACEMENT

TECHNICAL FIELD

Described are methods of forming a top oxide of a memory cell and/or improving quality of a top oxide of a memory cell using a sacrificial nitride layer with or without a gate replacement.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, or the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

In memory cells, single bits of data are stored in and read from respective memory cells. The cells are generally programmed by hot electron injection and erased by Fowler-Nordheim tunneling. The erase, program, and read operations are commonly performed by application of appropriate voltages to certain terminals of the memory cell. In an erase or write operation the voltages are applied so as to cause a charge to be removed or stored in a charge storage layer of the memory cell.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as scaling down device dimensions, the gate dielectric scaling is getting more difficult, due to the top and bottom oxide leakage increase. Thus, the requirement of small features with close spacing between adjacent features requires sophisticated manufacturing techniques.

SUMMARY

The following presents a simplified summary of the innovation described herein in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the subject innovation provides methods of forming a top oxide on a charge storage material layer of a memory cell. Another aspect of the subject innovation provides methods of improving quality of a top oxide of a memory cell. The methods can involve providing a charge storage layer on a semiconductor substrate, a nitride layer on the charge storage layer, and a first poly layer on the nitride layer, and converting at least a portion of the nitride layer to a top oxide. By converting at least a portion of a nitride layer to a top oxide, the quality of the resultant top oxide can be improved.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

DETAILED DESCRIPTION

Figure 1:
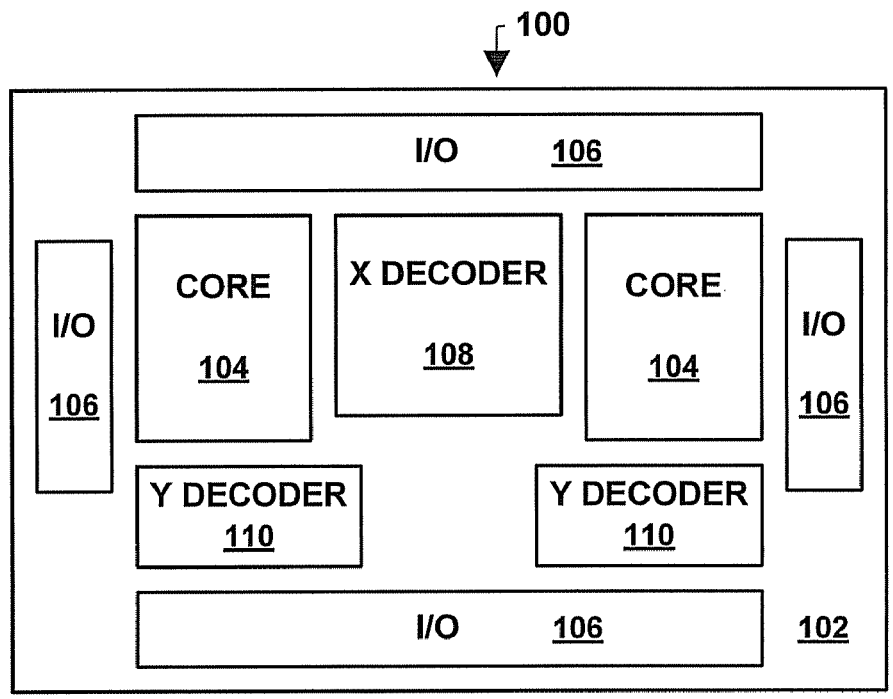
FIG. 1 illustrates a top view of an exemplary flash memory device in accordance with an aspect of the subject innovation.

In memory cells, erase, program, and read operations are commonly performed by application of appropriate voltages to certain terminals of the memory cells. In an erase or write operation the voltages are applied so as to cause a charge to be removed or stored in the memory cell. In a read operation, appropriate voltages are applied so as to cause a current to flow in the memory cell, wherein the amount of such current is indicative of the value of the data stored in the cell. A memory device includes appropriate circuitry to sense the resulting cell current in order to determine the data stored therein, which is then provided to data bus terminals of the memory device for access by other devices in a system in which the memory device is employed.

Memory cells can contain a charge storage layer over a semiconductor substrate and a first poly gate around the charge storage layer. The charge storage layer can contain a bottom tunnelling oxide, a charge storage element, and a top oxide. The top oxide can function to isolate the transfer of charges between the storage element and the first poly, permitting scaling of the storage element to realize low programming voltages. To achieve efficient program and erase, the current through a bottom oxide needs to be much larger than a current through a top oxide during the program and erase operations. However, the lower the quality of the top oxide, the more charge may leak through such a layer. For this reason, the quality of the top oxide is an important feature in a memory device.

The innovation disclosed herein provides methods of forming a top oxide on a charge storage material layer of a memory cell and/or improving quality of a top oxide of a memory cell. To improve the quality of the top oxide, a sacrificial nitride layer can be formed in an intermediate memory cell, and the sacrificial nitride layer is converted to an oxide layer by, for example, oxidization. The methods can be performed on the memory devices before finally defining poly word lines by lithography and etching techniques.

One advantage of the methods is improving quality of a top oxide of a memory device by converting a sacrificial nitride layer to a top oxide layer. In one embodiment, by oxidizing a sacrificial nitride layer, the quality of the resulting top oxide can be improved. For example, a high F-N field of the top oxide can be achieved. Charge leakage paths can be reduced and/or minimized at the interface between the top oxide and the charge storage layer. In another embodiment, by converting a sacrificial nitride layer to a top oxide, any suitable height of the resulting top oxide can be achieved. The methods described herein therefore effectively addresses the concerns raised by the trend towards the miniaturization of memory devices.

The top oxide formation/improvement described herein can be applied to any suitable type of memory cell. For example, the top oxide formation/improvement can be applied to single-level memory cells, multi-level memory cells, single bit memory cells, dual bit memory cells, quad bit memory cells, or the like. The dual bit memory is a relatively modern memory technology and allows multiple bits to be stored in a single memory cell. The dual bit memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit storage of two bits.

A dual bit memory cell can have a semiconductor substrate with implanted conductive bit lines. A charge storage layer can contain one or more layers and can be formed over the semiconductor substrate. For example, the charge storage layer can contain three separate layers: a first insulating layer, a charge storage dielectric layer, and a second insulating layer. Word lines are formed over the charge storage layer substantially perpendicular to the bit lines. Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the innovation.

Although the top oxide formation/improvement can be applied to any type of memory cell, the innovation is hereinafter illustrated and described in the context of an exemplary semiconductor device having one or more memory arrays containing dual bit memory cells arranged in a virtual ground type array architecture. FIG. 1 illustrates a top view of an exemplary dual bit flash memory device 100. The memory device 100 generally includes a semiconductor substrate 102 in which one or more high-density core regions 104 and one or more lower-density peripheral regions are formed. The high-density core regions 104 typically include one or more M by N arrays of individually addressable, substantially identical dual bit memory cells. The lower-density peripheral regions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
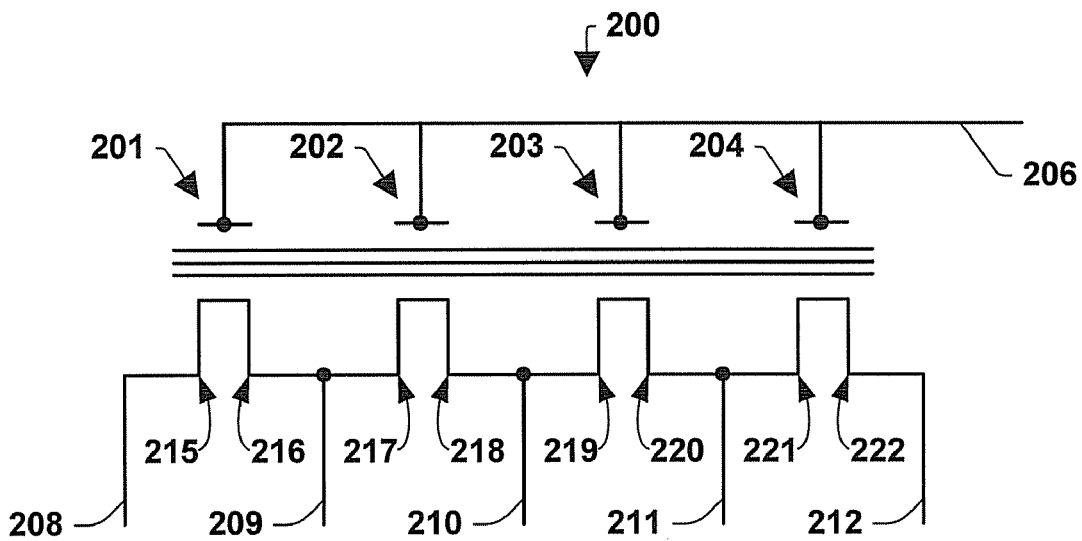
FIG. 2 is a schematic illustration of a portion of a memory core such as may include at least part of one of the cores depicted in FIG. 1 in a virtual ground type configuration in accordance with a first aspect of the subject invention.

FIG. 2 is a schematic illustration of a portion 200 of an exemplary memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively.

Depending upon a signal on the word line and the connection of the bit lines in a memory cell to an electrical source or drain, the memory cells 201 through 204 are capable of writing, reading, and erasing bits at locations 215 through 222. For example, control of the bit at location 215 is achieved through connection of the drain to the bit line 208 and the source to the bit line 209. Similarly, control of the bit at location 216 is achieved through connection of the drain to the bit line 209 and the source to the bit line 208. It will be appreciated that although adjacent memory cells share common bit lines, the adjacent memory cells do not interfere with each other because the memory cells are typically programmed one at a time and in such instances only one memory cell is active at a time while programming.

Figure 3:
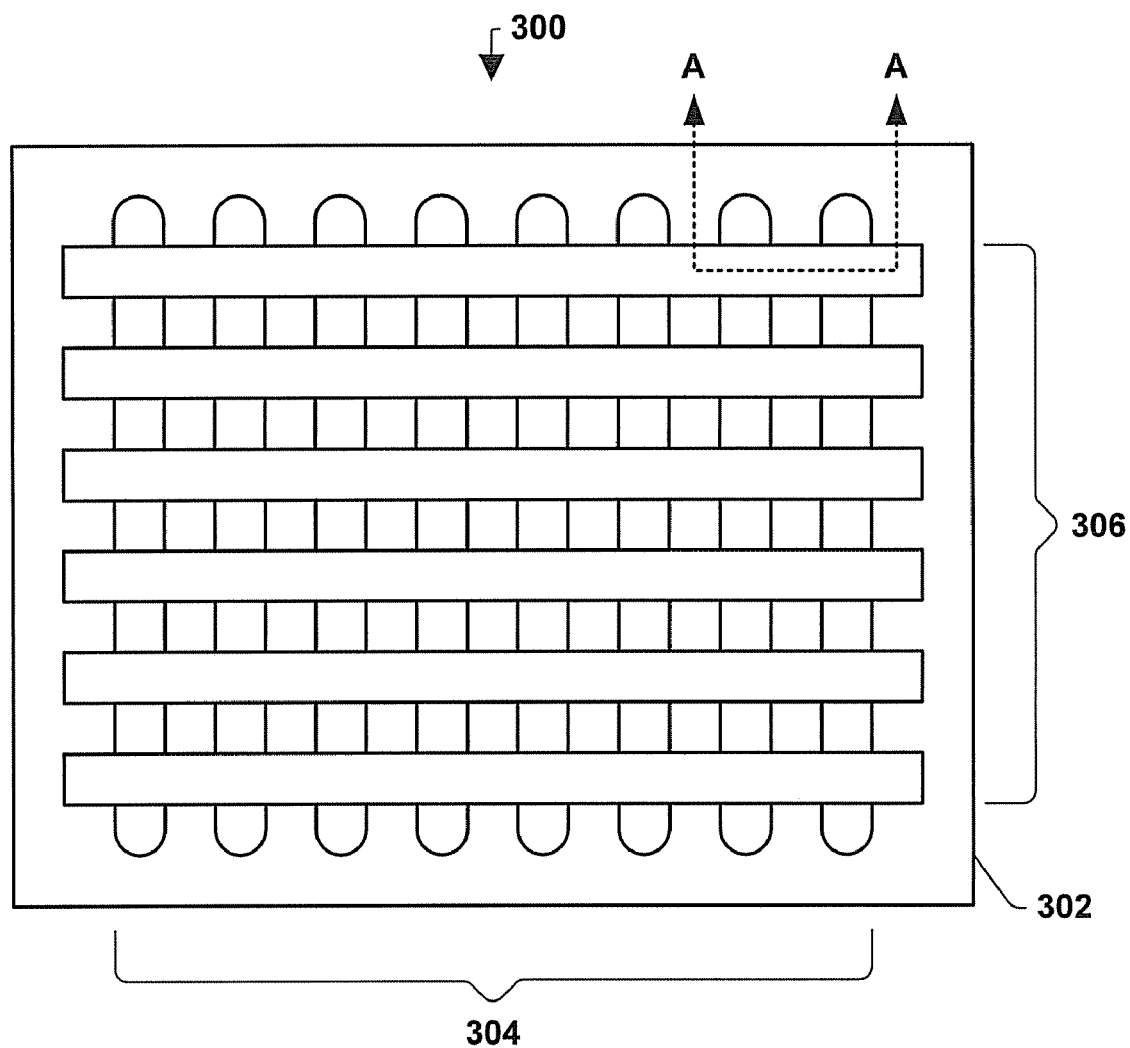
FIG. 3 is a top view of at least a portion of a memory core, such as may include at least part of one of the cores depicted in FIG. 1 in accordance with a first aspect of the subject invention.

FIG. 3 illustrates a top view of at least a portion 300 of a memory core, such as may include at least part of one of the M by N array cores 104 depicted in FIG. 1. The memory 300 is formed upon a semiconductor substrate 302 and has a plurality of implanted bit lines 304 extending substantially parallel to one another, and further includes a plurality of formed word lines 306 extending substantially in parallel to one another and at substantially right angles to the plurality of implanted bit lines 304. The word lines 306 are disposed over and separated from the bit lines 304 by a dielectric stack (not shown) in a grid arrangement. The memory core 300 can include a bit line contact region (not shown) between word lines 306. The bit line contact region can be used to establish electrical connection to the bit lines through the dielectric stack. It will be appreciated that the bit lines 304 and word lines 306 have contacts and interconnections (not shown) to programming circuitry such as may be represented, at least in part, by x-decoders and y-decoders.

Figure 4:
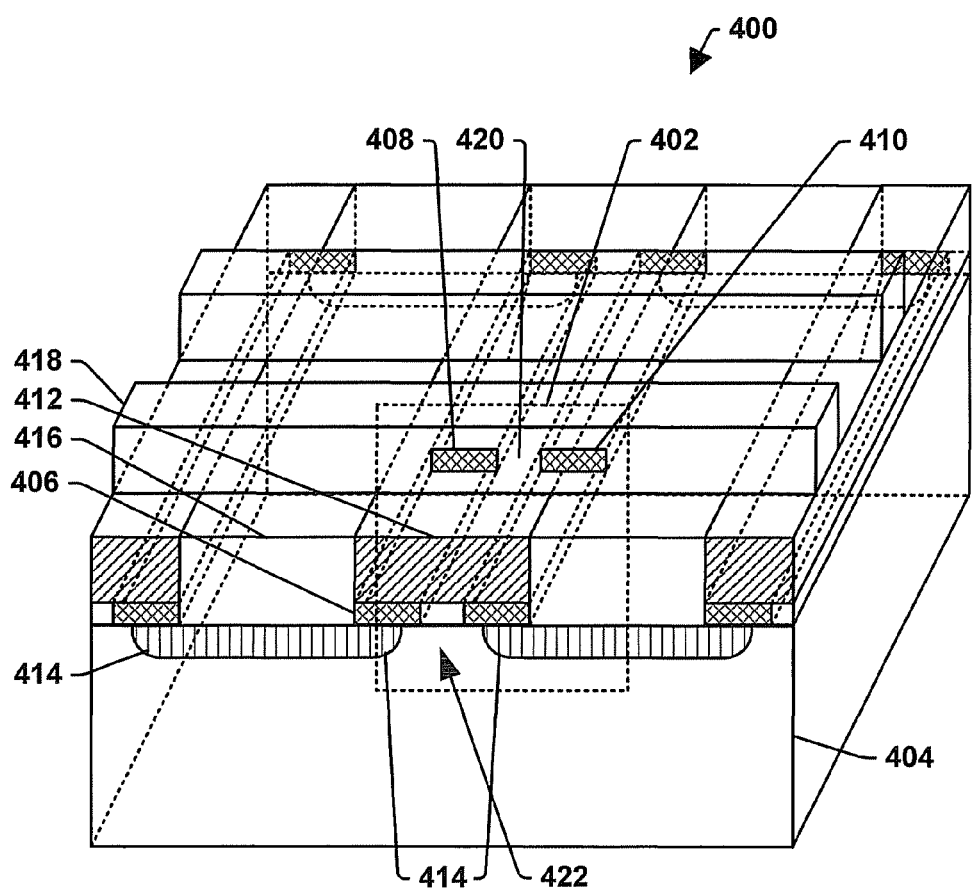
FIG. 4 is a cross-sectional isometric illustration of exemplary memory cells, such as that taken along line A-A of FIG. 3 in accordance with a first aspect of the subject invention.

FIG. 4 is a cross-sectional isometric illustration of a portion of a memory device 400 containing a dual bit memory cell 402 as indicated by a dashed line, such as that taken along line A-A of FIG. 3. The dual bit memory cell 402 is formed on a semiconductor substrate 404. The memory cell 402 contains a charge storage layer 406 containing two charge storage nodes 408, 410 on the semiconductor substrate 404; a first poly 412 on the charge storage layer 406; a pair of bit lines 414 in the semiconductor substrate 404 adjacent the charge storage layer 406 and under a bit line dielectric 416; and a word line 418. In one embodiment, the two charge storage nodes 408, 410 are physically separated from each other by a central dielectric 420 in the charge storage layer 406. In another embodiment, the two charge storage nodes are not physically separated in a single charge storage layer (not shown). The memory cell 402 is separated from adjacent memory cells by the bit line dielectric 416 such as oxides (e.g., silicon oxide, high temperature oxide (HTO), high density plasma (HDP) oxide).

The charge storage layer 406 can contain a bottom tunneling oxide, a charge storage material layer, and a top oxide thereon. Since the memory cell 402 has the two charge storage nodes 408, 410 in the charge storage layer 406, the memory cell 402 can store two physically distinct bits. Each bit within the memory cell 402 serves as a binary unit of data (e.g., either 1 or 0) that can be mapped directly to a memory array. Reading or programming one side of charge storage nodes 408, 410 can occur independently of whatever data is stored on the opposite side of the charge storage nodes 408, 410.

Two conductive bit lines 414 are depicted in FIG. 4 underlying the charge storage layer 406. It will be appreciated that any number of such bit lines can be implanted into the semiconductor substrate 404, and that such bit lines may correspond to the bit lines 304 depicted in FIG. 3. The bit lines 414 typically contain an implanted n-type material, such as arsenic, and may include an oxide portion (not shown) in some examples. The two conductive bit lines 414 are spaced apart and define a channel region 422 therebetween. The semiconductor substrate 404 can contain pocket implant regions (not shown) adjacent the charge storage layer 406. The pocket implant regions typically contain an implanted p-type material, such as boron. The pocket implant regions can facilitate controlling a threshold voltage of the memory cell 402.

Two conductive word lines 418 are similarly depicted overlying the charge storage layer 406. It will be appreciated that any number of such word lines can be formed over the charge storage layer 406, and that such word lines may correspond to the word lines 306 depicted in FIG. 3. The word lines 418 can contain a polysilicon material, for example, where the polysilicon material may be deposited over the charge storage layer 406 and then patterned and etched.

Locations 408 and 410 indicate generally where respective bits of data can be stored in a memory cell 402. It will be appreciated that the channel 422 has an effective length and that the bits will be brought closer together as this length is reduced (e.g., as a result of scaling).

Figure 5:
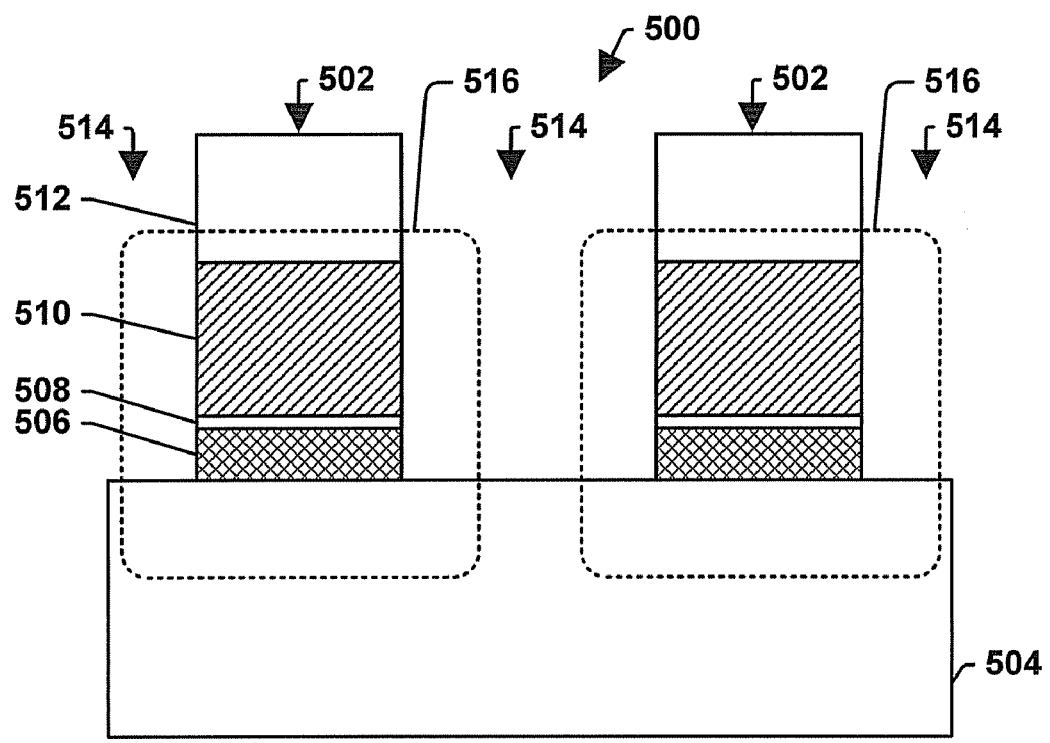
FIGS. 5-10 illustrate an exemplary method of forming a top oxide of a memory cell in accordance with a second aspect of the subject innovation.

Referring to FIGS. 5 to 10 and FIGS. 11 to 17, two of many possible exemplary embodiments of forming a top oxide of a memory cell and/or improving the quality of a top oxide of a memory cell are specifically illustrated. FIG. 5 illustrates a cross sectional view of an intermediate state of a portion of an exemplary memory device 500. The memory device 500 can contain one or more features 502 on a semiconductor substrate 504. The features 502 can contain a dielectric layer 506, a nitride layer 508, a first poly layer 510, and a first mask layer 512. The memory device 500 has bit line openings 514 between the features 502. A memory cell is formed in the subsequent processes at a position indicated by a dashed line 516.

For simplicity of illustration in FIG. 5, two features 502 and three bit line openings 514 are shown. However, the memory device 500 can have any suitable number of features and bit line openings. For example, the memory device 500 can have a M×N array of features 502 with M rows and N columns.

The semiconductor substrate 504 may contain any suitable semiconductor material on which electric devices such as memory cell transistors can be formed. Examples of semiconductor materials include silicon, gallium arsenide, indium phosphide, or the like.

The dielectric layer 506 can contain any suitable dielectric material such as oxide materials. Examples of oxides include silicon oxide, HTO, or the like. In another embodiment, the dielectric layer 506 contains an oxide that is formed using a Slot Plane Antenna (SPA) process. In yet another embodiment, the dielectric layer 506 contains an oxide that is formed using an in-site steam generation (ISSG) process.

The height of the dielectric layer 506 can vary and is not critical to the subject innovation. The height of the dielectric layer 506 may depend on, for example, the desired implementations and/or the memory device 500 being fabricated. In one embodiment, the height of the dielectric layer 506 is about 10 nm or more and about 100 nm or less. In another embodiment, the height of the dielectric layer 506 is about 15 nm or more and about 70 nm or less. In yet another embodiment, the height of the dielectric layer 506 is about 20 nm or more and about 50 nm or less. In still yet another embodiment, the height of the dielectric layer 506 is about 30 nm.

The nitride layer 508 can contain any suitable nitride material. Any nitride layer can be employed as long as the nitride layer can be converted to a top oxide by, for example, oxidization in a subsequent process. The nitride layer 508 can be partially or entirely oxidized to form a top oxide layer in a subsequent process. Examples of nitrides include silicon nitride materials such as silicon nitride ($Si_xN_y$), silicon rich silicon nitride, and oxygen rich silicon nitride; or the like. Since the nitride layer 508 is converted to a top oxide, the nitride layer 508 may be referred to as a sacrificial layer or sacrificial nitride layer.

The nitride layer 508 can be formed by any suitable technique. For example, the nitride layer 508 is formed by chemical vapor deposition (CVD) such as plasma enhanced chemical vapor deposition (PECVD), low pressure chemical vapor deposition (LPCVD), high pressure chemical vapor deposition (HPCVD), or the like.

The height of the nitride layer 508 can vary and is not critical to the subject innovation. The height may depend on, for example, the desired implementations and/or the memory device 500 being fabricated. In one embodiment, the height of the nitride layer 508 is about 0.2 nm or more and about 10 nm or less. In another embodiment, the height of the nitride layer 508 is about 0.5 m or more and about 7 nm or less. In yet another embodiment, the height of the nitride layer 508 is about 1 nm or more and about 3 nm or less.

The first poly layer 510 typically contains polysilicon. The first poly 510 can be formed over the semiconductor substrate 504 by, for example, CVD. The height of the first poly 510 may vary and is not critical to the subject innovation. The height may depend on, for example, the desired implementations and/or the memory device 500 being fabricated. In one embodiment, the height of the first poly 510 is about 50 nm or more and about 300 nm or less. In another embodiment, the height of the first poly 510 is about 60 nm or more and about 200 nm or less. In yet another embodiment, the height of the first poly 510 is about 70 nm or more and about 150 nm or less. In still yet another embodiment, the height of the first poly 510 is about 100 nm.

The first mask layer 512 may contain any suitable mask material. Examples of mask materials include oxides such as silicon oxide ($Si_xO_y$) and silicon-dioxide ($SiO_2$); nitrides such as silicon nitride ($Si_xN_y$), silicon rich nitride, and oxygen rich silicon nitride; or the like.

Although not shown, an anti-reflective coating (ARC) can be formed on the first mask layer 512 for increasing resolution of a lithography process to form the features 502. Any suitable ARC material can be employed. For example, ARC contains oxides such as silicon oxide ($Si_xO_y$) and silicon-dioxide ($SiO_2$); nitrides such as silicon nitride ($Si_xN_y$), silicon rich nitride, and oxygen rich silicon nitride; carbides such as silicon carbide ($Si_xC_y$); amorphous carbon; or the like.

The features 502 can be formed on the semiconductor substrate by any suitable technique. For example, a dielectric layer is formed on a semiconductor substrate, a nitride layer is formed on the dielectric layer, a first poly layer is formed on the dielectric layer, and a first mask layer is formed on the first poly layer. The first mask layer is patterned by removing portions of the first mask layer via, for example, lithography and etching techniques, thereby forming a patterned first mask layer 512 and exposing portions of the first poly layer, the nitride layer, and the dielectric layer. The first poly layer, the nitride layer, and the dielectric layer are patterned by removing the exposed portions that are not covered with the patterned first mask layer, thereby forming the patterned first poly layer 510, the patterned nitride layer 508, and the patterned dielectric layer 506.

Figure 6:
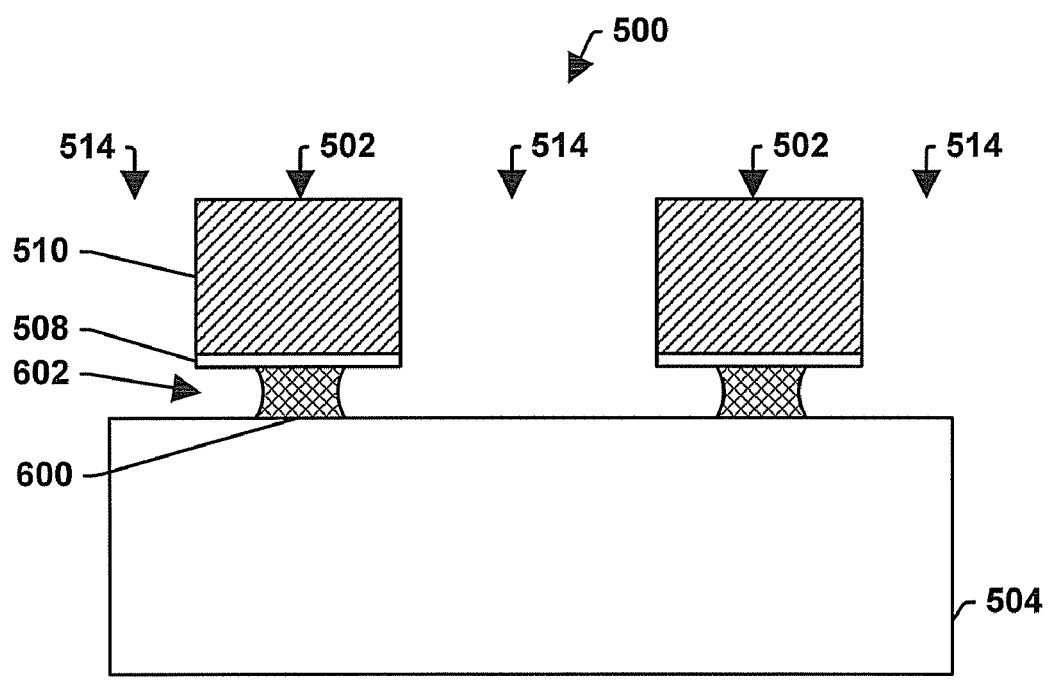

FIG. 6 illustrates forming an undercut portion 600 of the dielectric layer 506 and openings 602 between the semiconductor substrate 504 and the nitride layer 508 by removing end portions of the dielectric layer 506. By removing the end portions of the dielectric layer 506, portions of bottom surfaces of the nitride layer 508 are exposed in the opening 602. The end portions of the dielectric layer 506 can be removed by, for example, etching. Charge storage nodes are formed in the openings 602 in subsequent processes, and the undercut portion 600 of the dielectric layer 506 becomes a center dielectric between the charge storage nodes.

Portions (e.g., end portions) of the dielectric layer 506 are removed by any suitable etchant. When the dielectric layer 506 contains oxide materials, portions of the dielectric layer 506 can be removed by contacting the dielectric layer 506 with any suitable oxide etchant that does not substantially affect or damage the integrity of other layers in the memory device 500 such as the first poly layer 510. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. Other oxide etchants can also be used as long as they are capable of removing portions of the dielectric layer 506 selective to other layers such as the first poly layer 510.

FIG. 6 also illustrates removing the first mask layer 512, thereby exposing the first poly 510. The first mask layer 512 can be removed by any suitable technique, for example, etching. For example, when the first mask layer 512 contains nitride materials, the first mask layer 512 can be removed by contacting the first mask layer 512 with any suitable nitride etchant under any suitable condition that does not substantially affect or damage the integrity of other layers of the memory device 500. Examples of nitride etchants include phosphoric acid. Other nitride etchants can also be used as long as they are capable of removing the first mask layer 512 under conditions that are selective to other layers of the memory device 500.

FIG. 7a illustrates converting the exposed portion of the nitride layer 508 in the opening 602 to an oxide layer 700. The oxide layer 700 can be formed by, for example, oxidizing the exposed portion of the nitride layer 508. The oxide layer 700 becomes a top oxide layer of a subsequently formed charge storage node. A top oxide is formed by converting the sacrificial nitride layer 508 to an oxide layer and not by growing an oxide layer on a surface of a poly layer. As a result, in one embodiment, the method does not involve growing a top oxide on a surface of a poly layer by, for example, oxidizing the poly layer. A portion of the intermediate charge storage node indicated by a dashed line 702 is exploded in FIG. 7b.

The nitride layer 508 can be oxidized by any suitable technique. For example, the nitride layer 508 is oxidized by thermal oxidation, plasma oxidation, liquid chemical oxidation, combinations thereof, or the like. In the thermal oxidation, the nitride layer 508 can be oxidized at elevated temperatures in an $O_2$ atmosphere. In one embodiment, the nitride layer 508 is oxidized at about 600 degrees Celsius or more and about 800 degrees Celsius or less. In the plasma oxidation, the nitride layer 508 is oxidized by using a plasma gas containing oxygen ($O_2$), ozone ($O_3$), nitrous oxide ($N_2O$), or the like at a temperature of about 200 degrees Celsius or more and about 600 degrees Celsius or less. A HDP process or SPA process can be employed to oxidize the nitride layer. In the liquid chemical oxidation, the nitride layer 508 is contacted with, for example, a liquid mixture of sulfuric acid and hydrogen peroxide water; ozone water; or the like at a temperature of about 10 degrees Celsius or more and about 600 degrees Celsius or less. These oxidation processes can be employed individually or in combination. For example, after the plasma oxidation is performed, the liquid chemical processing can be performed.

In one embodiment, the nitride layer 508 is oxidized by a low temperature oxidation process such as a low temperature radical oxidation, a low temperature plasma oxidation process, or the like. The low temperature oxidation may advantageously not change the electrical properties of components/layer of the memory device 500. For example, the low temperature oxidation does advantageously not change a doping profile of implanted regions in the semiconductor substrate 500.

Any suitable oxygen reactant can be employed in the low temperature oxidation process. For example, atomic oxygen, ozone, ionized oxygen radicals produced in a plasma can be employed. In one embodiment, the nitride layer 508 is oxidized at a temperature of about 200 degrees Celsius or more and about 600 degrees Celsius or less. In another embodiment, the nitride layer 508 is oxidized at a temperature of about 220 degrees Celsius or more and about 550 degrees Celsius or less. In yet another embodiment, the nitride layer 508 is oxidized at a temperature of about 240 degrees Celsius or more and about 500 degrees Celsius or less.

In one embodiment, the surfaces of the semiconductor substrate 504, the dielectric undercut portion 600, the first poly layer 510, or combinations thereof are oxidized at the same time that the portions of the nitride layer 508 is oxidized. For example, when the dielectric undercut portion 600 contains materials that can be oxidized, an oxide layer 704 can be formed on the surface of the dielectric undercut portion 600. When the dielectric undercut portion 600 does not contain materials that can be oxidized, an oxide layer is not formed on the surface of the dielectric undercut portion 600 (not shown). When the semiconductor substrate 504 and/or the first poly layer 510 contain silicon, a silicon oxide layer 704 can be formed on the surfaces of the semiconductor substrate 504 and/or the first poly layer 510.

Figure 7:
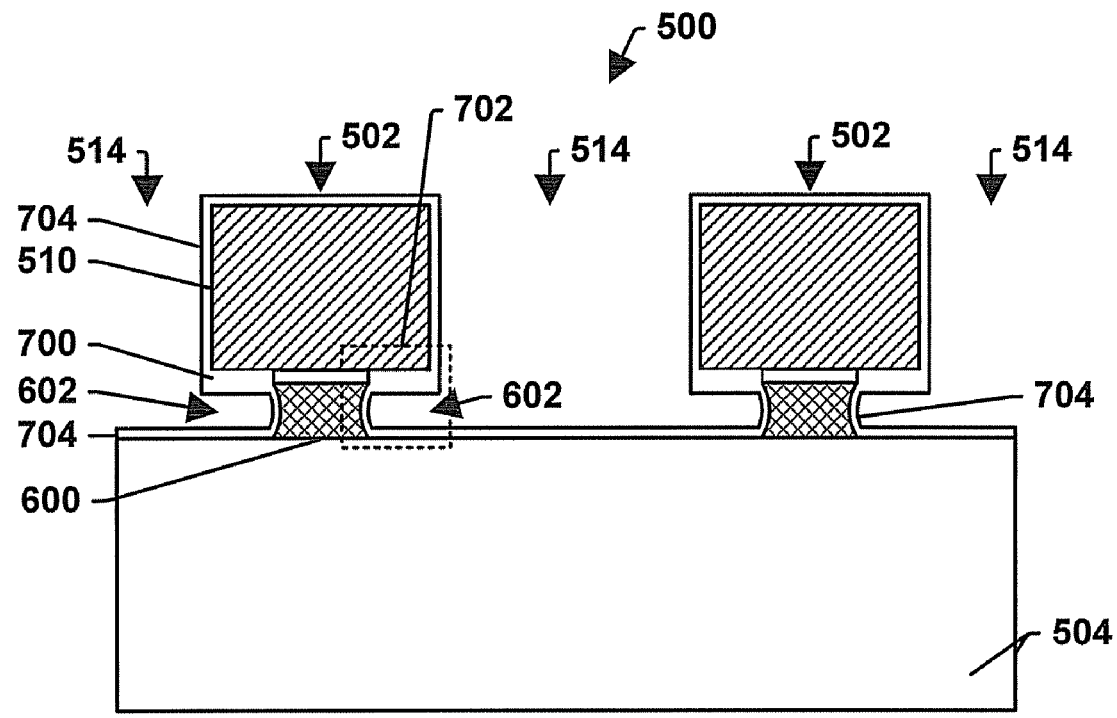
Figure 7B:
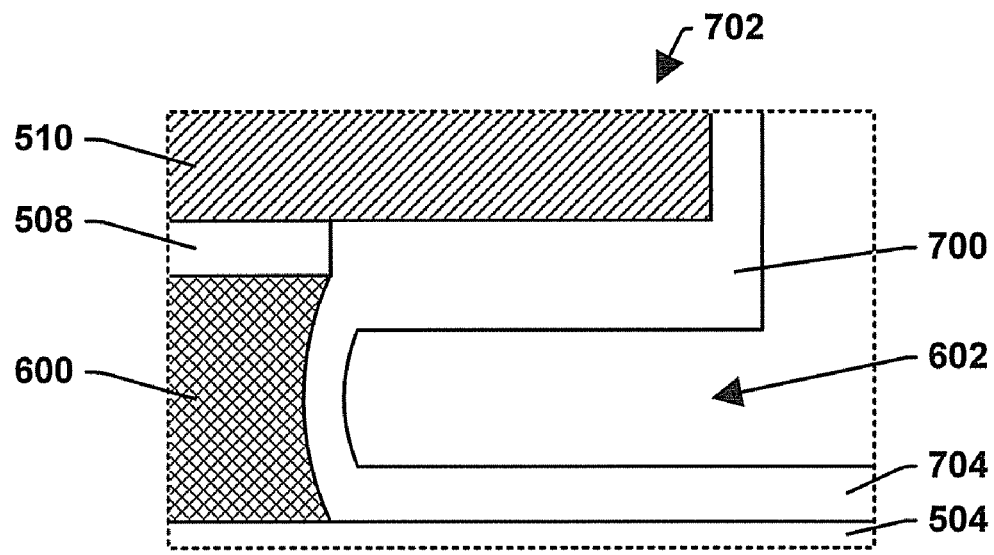

FIG. 7b illustrates an exploded view of a portion of an exemplary intermediate charge storage node indicated by a dashed line 702 in FIG. 7a after converting the nitride layer 508 to a top oxide layer 700. In this example, an oxide layer 704 is also formed on the surfaces of the semiconductor substrate 504, the dielectric undercut portion 600, and the first poly layer 510. When the nitride layer 508 contains silicon nitride materials (e.g., $Si_3N_4$), the resultant oxide layer 700 can contain silicon oxide materials (e.g., $SiO_2$).

The height of the top oxide 700 can be controlled by, for example, adjusting oxidation conditions. The height of the top oxide 700 can vary and is not critical to the subject innovation. The top oxide 700 has any suitable height that depends on the desired implementations and/or the memory device 500 being fabricated. In one embodiment, the height of the top oxide 700 is about 1 nm or more and about 20 nm or less. In another embodiment, the height of the top oxide 700 is about 2 nm or more and about 16 nm or less. In yet another embodiment, the height of the top oxide 700 is about 3 nm or more and about 14 nm or less.

Figure 8A:
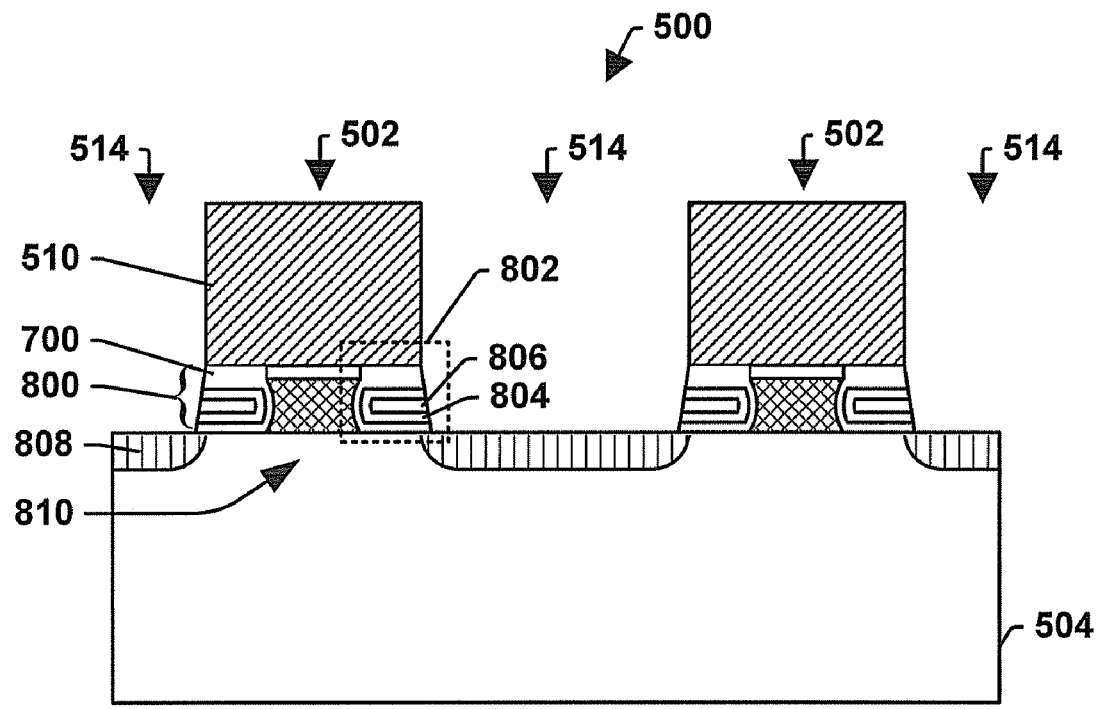

FIG. 8a illustrates forming charge storage nodes 800 in the openings 602 between the semiconductor substrate 504 and the first poly layer 510. The charge storage node 800 indicated by a dashed line 802 is exploded in FIG. 8b. The charge storage nodes 800 and the undercut dielectric portion 600 may be referred to as a charge storage layer.

The configuration and/or constituent of the charge storage node 800 can vary and are not critical to the subject innovation. The charge storage node 800 generally can contain any suitable charge storage dielectric material (e.g., charge storage material layer). Examples of charge storage dielectric materials include nitrides (e.g., silicon nitride, silicon oxynitride, and silicon rich nitride), oxides, silicates, a high-k dielectric, for example, having a dielectric constant higher than that of silicon dioxide ($SiO_2$), or the like. In one embodiment, the charge storage dielectric material contains silicon nitride, silicon oxynitride, and/or silicon rich nitride. In another example, the charge storage material contains oxides or silicates containing Al, Ta, Hf, La, Zr, Ti, Nb, Cr, V, Y, Ce and/or Pr. The charge storage node 800 can be formed on the semiconductor substrate 504 by any suitable technique. For example, the charge storage node 800 can be formed by CVD, lithography, and etching techniques.

Specific examples of charge storage node 800 include an oxide/nitride/oxide tri-layer, an oxide/nitride bi-layer, a nitride/oxide bi-layer, an oxide/tantalum oxide hi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), or the like.

In one embodiment, the charge storage node 800 can contain three layers: a first insulating layer, a charge storage material layer, and a second insulating layer. The first and second insulating layers can contain an oxide dielectric such as silicon dioxide ($SiO_2$) and the charge storage material layer can contain a nitride dielectric such as silicon nitride ($Si_xN_y$). The oxide-nitride-oxide configuration may be referred to as an ONO layer. Especially, when the nitride dielectric contains silicon rich nitride, the oxide-nitride-oxide configuration may be referred to as an ORO layer. The oxide-nitride-oxide layer can be fabricated by forming a first silicon oxide layer, forming a silicon nitride layer on the first silicon oxide layer, and forming a second silicon oxide layer on the silicon nitride layer. In one embodiment, the first and second insulating layers are made of a single insulating layer and ends of the first and second insulating layers are connected with each other.

In another embodiment, the charge storage node 800 can contain five layers, for example, first oxide-first nitride-polysilicon-second nitride-second oxide. The oxide-nitride-polysilicon-nitride-oxide configuration may be referred to as an ORPRO layer when the charge storage nitride layer contains silicon rich nitride. In one embodiment, the first and second oxide layers are made of a single oxide layer and connected with each other. In another embodiment, the first and second nitride layers made of a single nitride layer and connected with each other.

By way of illustration, the charge storage nodes 800 of FIG. 8a contain an ORPRO layer containing an oxide layer 700, a charge storage silicon rich nitride layer 804, and a polysilicon layer 806. The ORPRO layer can be formed by any suitable technique. For example, a silicon rich nitride layer is formed on the oxide layer 700, 704 by, for example, deposition techniques (e.g., CVD, spin-on techniques, or the like). A polysilicon layer is formed in an opening surrounded with the nitride layer by, for example, deposition techniques (e.g., CVD, spin-on techniques, or the like). Then, portions of the oxide layer 704, the nitride layer, and the polysilicon layer that are not covered with the first poly layer 510 and/or suitable masks are removed by, for example, etching. The removed portions of oxide layer 704 contain, for example, the portions of the oxide layer 704 on the surfaces of the first poly 510 and/or the semiconductor substrate 504. The portions can be removed by, for example, etching. For example, portions of the oxide layer 704 can be removed by contacting the oxide layer with any suitable oxide etchant that does not substantially affect or damage the integrity of other components/layers of the memory device 500. The oxide etching can be dry etching or wet etching. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. In yet another embodiment, portions of the oxide layer 704 is removed by an oxide etchant gas, such as $SiCl_4/Cl_2$, $BCl_3/Cl_2$, $CCl_4$, mixtures of fluorinated or chlorinated gases, mixtures of Freon-based gases, or the like.

In one embodiment, the charge storage nodes 800 have relatively a sloping side surface that extends perpendicular to the topological surface of the semiconductor substrate 504. In another embodiment, the charge storage nodes 800 have a relatively vertical side surface (not shown).

FIG. 8a also illustrates forming first bit lines 808 in the semiconductor substrate 504 under the bit line openings 514. The first bit lines 808 can be formed within the semiconductor substrate 504 adjacent the charge storage nodes 800 and under the bit line opening 514 by any suitable technique. For example, the first bit line 808 is formed via implantation of one or more dopants. The dopants pass through the bit line opening 514 and are implanted into the semiconductor substrate 504 under the bit line opening 514, leaving a channel region 810 of the semiconductor substrate 504 between the first bit lines 808. Any suitable implant compositions and concentrations can be employed for the first bit lines 808. For example, the first bit lines 808 include one or more n-type dopants (e.g., arsenic, phosphorous, antimony).

Such dopants can be implanted at a dose of about 0.2 E15 atoms/cm$^2$ or more and about 4 E15 atoms/cm$^2$ or less and at an energy level of about 2 KeV or more and about 40 KeV or less, for example. In one embodiment, the semiconductor substrate 504 can contain other bit line implants (not shown). The buried first bit lines 808 can act as respective sources and drains for corresponding memory cells. As such, respective channels 810 are defined between corresponding pairs of buried first bit lines 808.

The first bit lines 808 can be formed at any suitable time. For example, the first bit lines 808 are formed at any suitable time after forming the bit line openings 514 and before forming bit line dielectrics in the bit line openings 514. In one embodiment, the first bit lines 808 are formed after forming the bit line openings 514 and before forming the openings 602 between the nitride layer 508 and the semiconductor substrate 504 or before forming the charge storage nodes 800 (not shown).

Figure 8B:
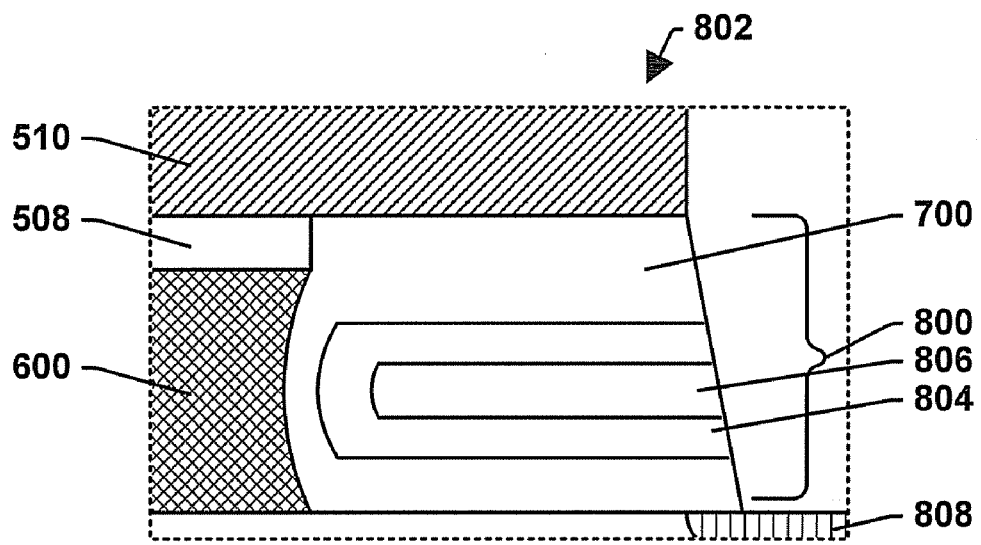

FIG. 8*b* illustrates an exploded view of an exemplary storage node 800 indicated by a dashed line 802 in FIG. 8*a*. In this example, the storage node 800 contains a top oxide 700, a charge storage nitride layer 804, and a polysilicon layer 806.

Figure 9:
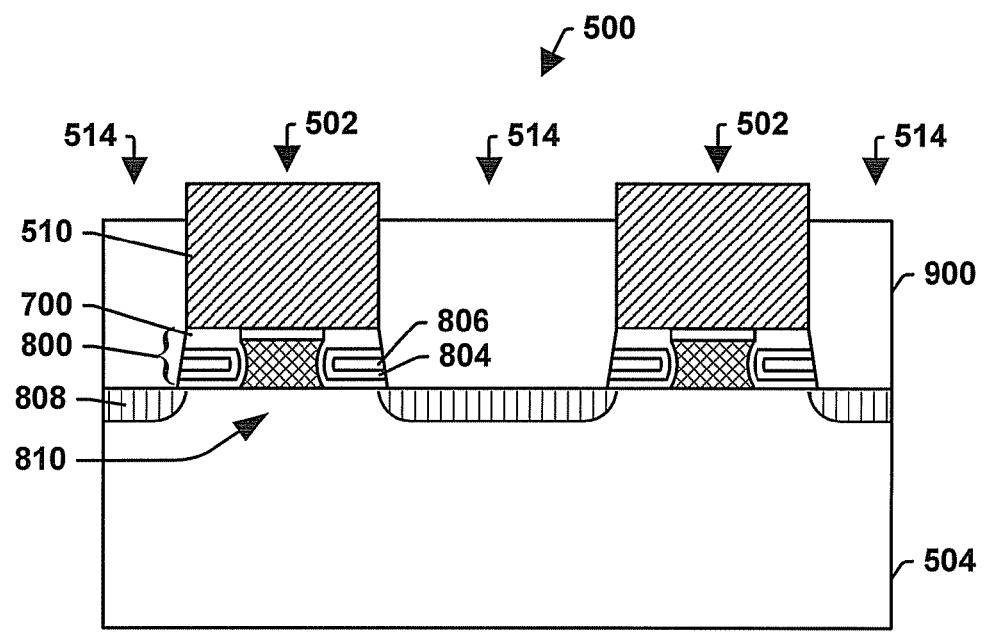

FIG. 9 illustrates forming bit line dielectrics 900 in the bit line openings 514. The bit line dielectric 900 can contain any suitable dielectric material such as oxides. Examples of oxides include silicon oxide, tetraethylorthosilicate (TEOS) oxide, high aspect ratio plasma (HARP) oxide, HTO, HDP oxide, or the like. The bit line dielectric 900 can be formed by any suitable technique. For example, a bit line dielectric layer is formed over the semiconductor substrate 504 and an upper portion of the bit line dielectric layer is removed, thereby leaving bit line dielectrics 900 in the bit line openings 514.

The bit line dielectric layer can be formed by any suitable technique. In one embodiment, the bit line dielectric layer is formed by a HTO deposition process. For example, the HTO is formed by low pressure chemical vapor deposition (LPCVD) using nitrous oxide (N$_2$O) and dichlorosilane (SiH$_2$Cl$_2$) gasses at a temperature of about 600 degrees Celsius or more and about 900 degrees Celsius or less and a pressure of about 100 mTorr or more and about 500 mTorr or less. In another embodiment, the bit line dielectric layer is grown in plasma at low temperatures, e.g., plasma-grown oxide. For example, the bit line dielectric layer contains plasma-grown oxide that is grown at a temperature of about 250 degrees Celsius or more and about 600 degrees Celsius or less. The bit line dielectric layer may be formed by a HDP deposition process. The bit line dielectric layer can be optionally subjected to an anneal in, for example, a nitrogen ambient at about 1,000 degrees Celsius for about thirty minutes.

An upper portion of the bit line dielectric layer can be removed by any suitable technique. For example, the upper portion of the bit line dielectric layer is removed by chemical-mechanical polishing (CMP) and/or etching. For example, the upper portion of the bit line dielectric layer is polished by CMP down to the upper surface of the first poly layer 510 under any suitable condition to facilitate removing/polishing the upper portion. The conditions generally depend upon, for example, the thickness of the bit line dielectric layer, the composition of the bit line dielectric layer, the desired implementations and/or the memory device 500 being fabricated, or the like.

The upper portion of the bit line dielectric layer can be removed by etching. For example, when the bit line dielectric layer contains oxide materials, the upper portion of the bit line dielectric layer can be removed by contacting the bit line dielectric layer with any suitable oxide etchant that does not substantially affect or damage the integrity of other layers in the memory device 500 such as the first poly layer 510. Any suitable oxide etchant can be used as long as it is capable of removing portions of the bit line dielectric layer selective to other layers such as the first poly layer 510.

Any suitable amount of the upper portion of the bit line dielectric layer can be removed. In one embodiment, the upper surface of the first poly layer 510 is higher than the resultant upper surface of the bit line dielectric 900. In another embodiment, the upper surface of the first poly layer 510 is substantially coplanar with the resultant upper surface of the bit line dielectric 900 (not shown). In yet another embodiment, the upper surface of the first poly layer 510 is lower than the resultant upper surface of the bit line dielectric 900 (not shown). Due to the removal of the upper portion of the bit line dielectric layer, the upper surface of the first poly layer 510 can be exposed.

Figure 10:
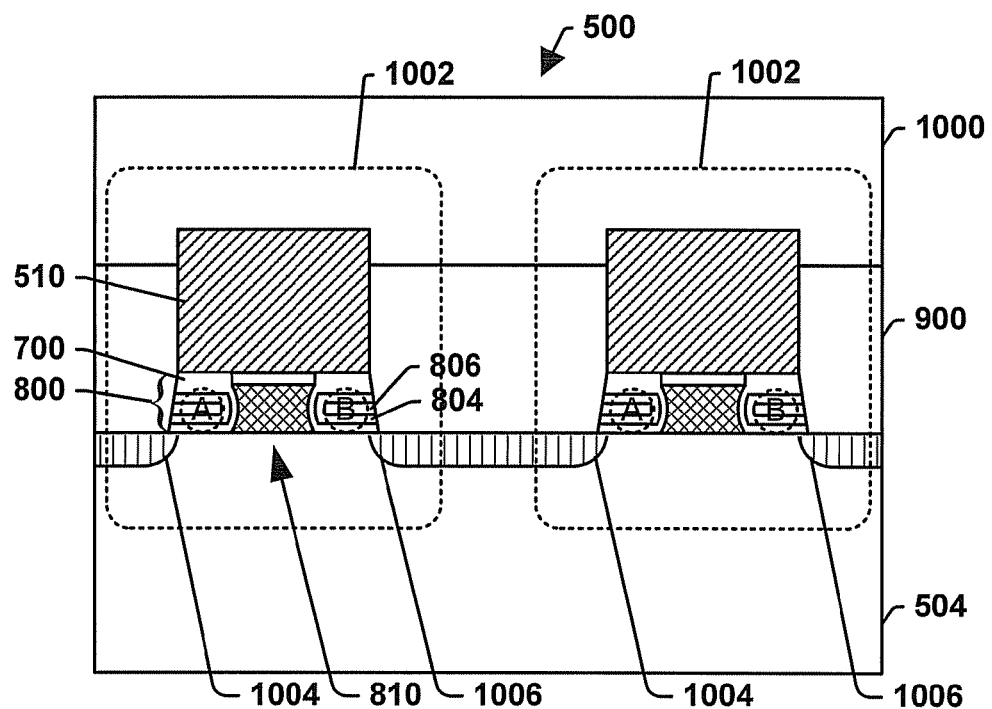

FIG. 10 illustrates forming a second poly layer or a word line 1000 over the semiconductor substrate 504, thereby forming a memory cell 1002 on the semiconductor substrate 504. The word line 1000 can contain any suitable conductive material such as polysilicon. The word line 1000 can be formed by, for example, forming a layer of word line material over the semiconductor substrate 504 and patterning (e.g., etching) the layer to establish the word line 1000 over the first bit lines 808. The first bit lines 808 and the word line 1000 are oriented at substantially right angles relative to one another.

The memory cell 1002 contains the two charge storage nodes 800 on a semiconductor substrate 504 and the first poly gate 510 on the charge storage nodes 800. The memory cell 1002 contains the first bit lines 808 in the semiconductor substrate 504 under the bit line openings 514. The two charge storage nodes 800 are separated from each other by the dielectric undercut portion 600. The top oxide layer 700 of the charge storage node 800 can be formed by oxidizing a sacrificial nitride layer 508. In this embodiment, the top oxide 700 is formed without replacing a first poly gate. The memory cells 1002 are separated from each other by the bit line dielectrics 900. The upper surface of the bit line dielectric 900 can be lower than the upper surface of the first poly gate 510.

The charge storage nodes 800 can store at least a bit of information, respectively. For example, the memory cell 1002 is capable of storing two spatially separated binary data bits, including a left bit represented by the dashed circle A and a right bit represented by the dashed circle B. When the memory cell 1002 is such a dual-bit memory cell, the dual-bit memory cell is generally symmetrical, wherein a drain and a source are interchangeable, although asymmetric implementations are possible within the scope of the innovation. In the exemplary memory cell 1002, the left first bit lines 1004 may serve as the source terminal and the right first bit lines 1006 as the drain terminal with respect to the right bit. Likewise, the right first bit lines 1006 may serve as the source terminal and the left first bit lines 1004 as the drain terminal for the left bit. The subject innovation may be implemented in association with various single or multi-bit memory cell types including a SONOS cell. In addition, the innovation is applicable to such dual-bit memory devices wherein both bits are used for data or information storage, as well as those in which only one bit (e.g., bit A) of the dual-bit cell is so used.

Figure 11A:
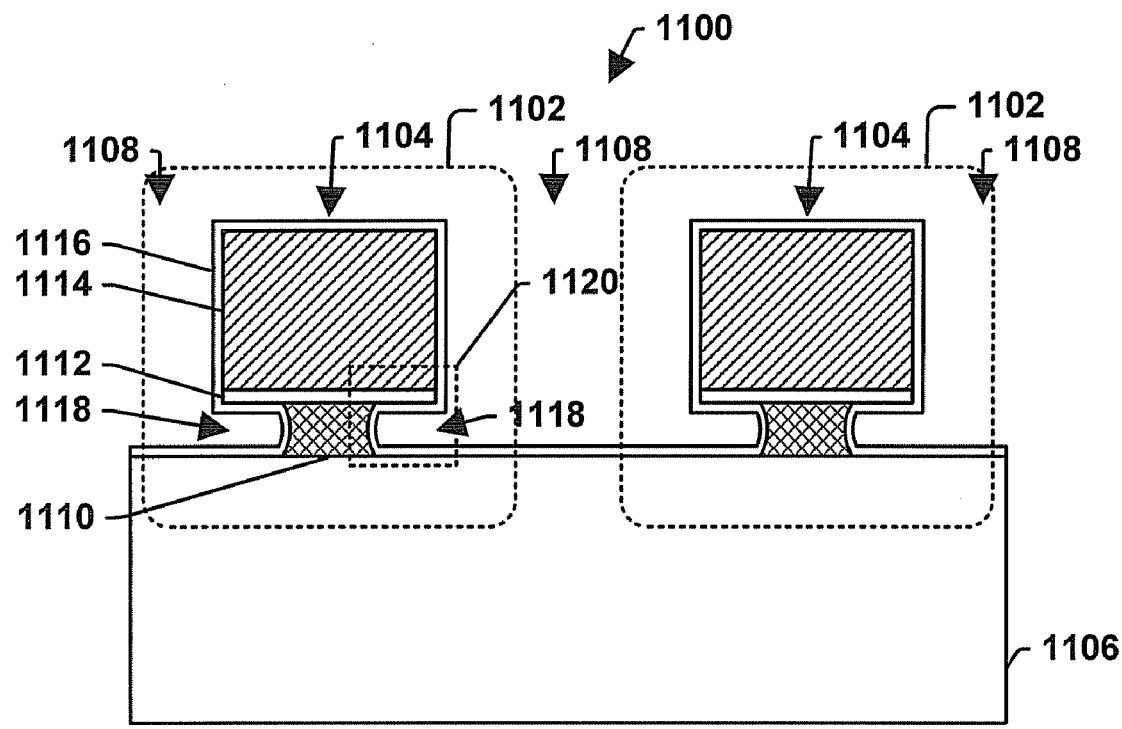
FIGS. 11-16 illustrate another exemplary method of forming a top oxide of a memory cell in accordance with a third aspect of the subject innovation.

FIG. 11a illustrates a cross sectional view of an intermediate state of a portion of another exemplary memory device 1100. The intermediate state of the memory device 1100 contains an intermediate state of one or more memory cells 1102. The intermediate state of the memory cell 1102 contains a feature 1104 on a semiconductor substrate 1106. The features 1104 are separated from each other on the semiconductor substrate 1106 by bit line openings 1108. The feature 1104 contains a dielectric undercut portion 1110 on the semiconductor substrate 1106, a nitride layer 1112 over the undercut portion 1110, a first poly layer 1114 over the nitride layer 1112, and an oxide layer 1116 over exposed surfaces of the semiconductor substrate 1106, the dielectric undercut portion 1110, the nitride layer 1112, the first poly layer 1114, or combinations thereof. The feature 1104 also contains openings 1118 around the undercut portion 1110 between the nitride layer 1112 and the semiconductor layer 1106. Charge storage nodes are formed in the openings 1118 in subsequent processes. A portion of the intermediate charge storage node indicated by a dashed line 1120 is exploded in FIG. 11b.

The feature 1104 contains the same structure as the feature 502 in connection with FIG. 6 except the oxide layer 1116. The oxide layer 1116 can be formed by any suitable technique. For example, the oxide layer 1116 is formed by oxidation techniques, deposition techniques such as CVD or spin-on techniques, or the like. In one embodiment, the oxide layer 1116 is formed by depositing oxide materials via CVD techniques. In another embodiment, the oxide layer 1116 is formed by oxidizing the surfaces of the semiconductor substrate 1106, the dielectric undercut portion 1110, the nitride layer 1112, the first poly 1114, or combinations thereof via, for example, SPA process.

The height of the oxide layer 1116 can be controlled by, for example, adjusting oxidation conditions and deposition conditions. The height of the oxide layer 1116 can vary and is not critical to the subject innovation. The oxide layer 1116 has any suitable height that depends on the desired implementations and/or the memory device 1100 being fabricated. In one embodiment, the height of the oxide layer 1116 is about 0.5 nm or more and about 10 nm or less. In another embodiment, the height of the oxide layer 1116 is about 1 nm or more and about 8 nm or less. In yet another embodiment, the height of the oxide layer 1116 is about 2 nm or more and about 7 nm or less.

The height of the nitride layer 1112 may vary and is not critical to the subject innovation. The height may depend on, for example, the desired implementations and/or the memory device 1100 being fabricated. In one embodiment, the height of the nitride layer 1112 is about 0.5 nm or more and about 10 nm or less. In another embodiment, the height of the nitride layer 1112 is about 1 nm or more and about 8 nm or less. In yet another embodiment, the height of the nitride layer 1112 is about 2 nm or more and about 7 nm or less.

Figure 11B:
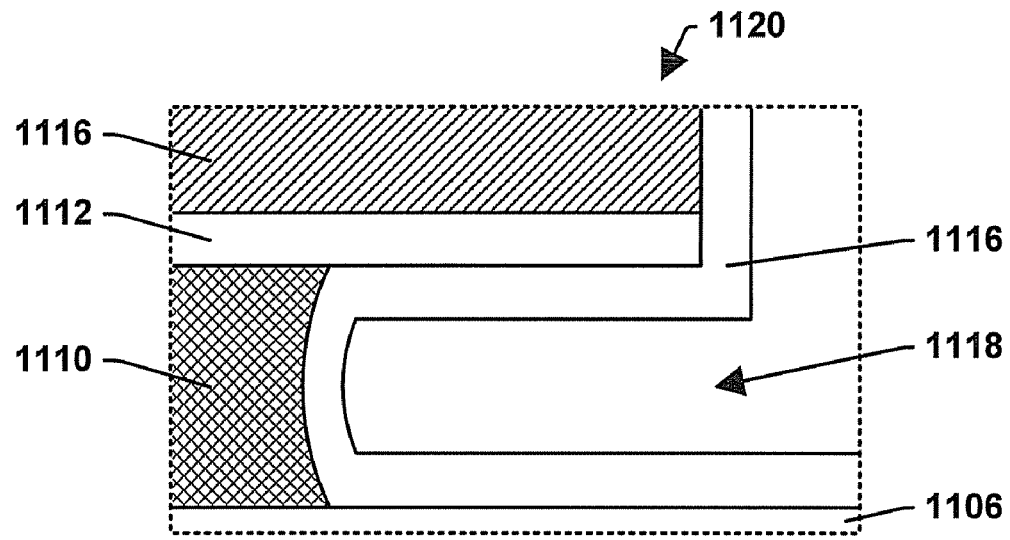

FIG. 11b illustrates an exploded view of a portion of an exemplary intermediate charge storage node indicated by a dashed line 1120 in FIG. 11a. In this example, an oxide layer 1116 is formed on the inner surfaces of the opening 1118 (e.g., the surfaces of the semiconductor substrate 1106, the dielectric undercut portion 1110, and the nitride layer 1112) by, for example, oxidation techniques or deposition techniques. In one embodiment, the oxide layer 1116 is formed by oxidizing the inner surfaces of the opening 1118. For example, portions of the bottom surface of the nitride layer 1112 are oxidized to form the oxide layer 1116. In another embodiment, when the dielectric undercut portion 1110 does not contain materials that can be oxidized, an oxide layer is not formed on the surface of the undercut portion 1110 by oxidation.

Figure 12A:
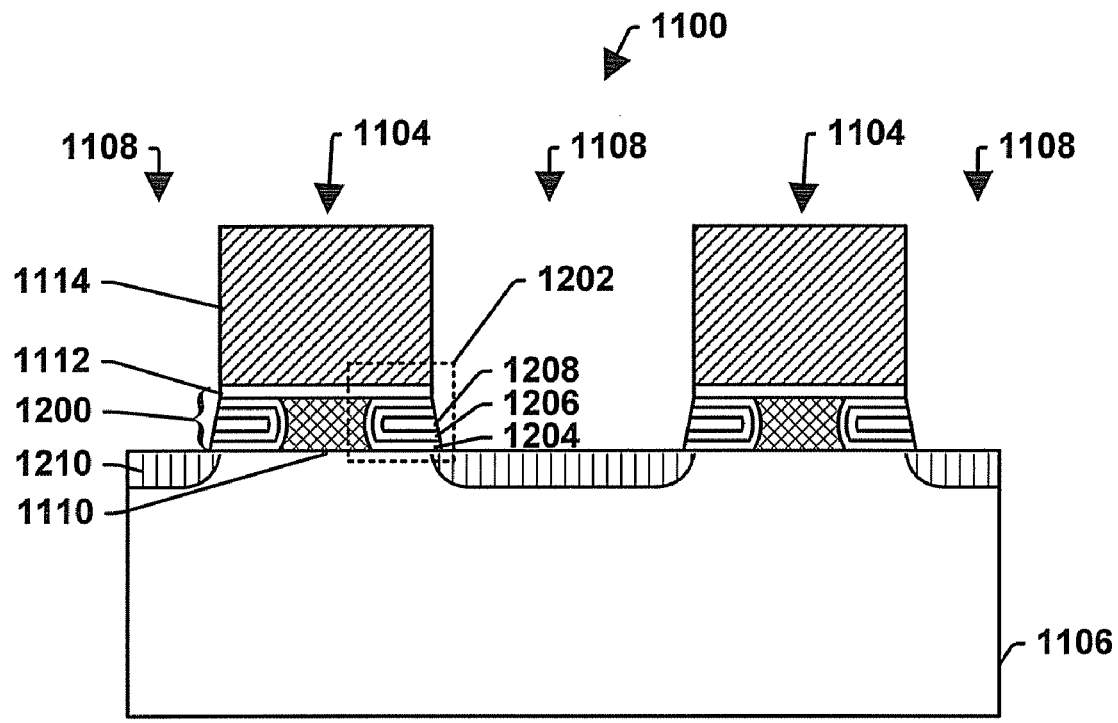

FIG. 12a illustrates forming charge storage nodes 1200 in the openings 1118 between the semiconductor substrate 1106 and the first poly layer 1114. The charge storage node 1200 indicated by a dashed line 1202 is exploded in FIG. 12b. The charge storage nodes 1200 and the undercut dielectric portion 1110 may be referred to as a charge storage layer.

The configuration and/or constituent of the charge storage node 1200 can vary and are not critical to the subject innovation. The charge storage node can contain any suitable charge storage dielectric material (e.g., charge storage material layer). For example, the charge storage node 1200 contains any of the materials of the charge storage node 800 as described above in connection with FIGS. 8a and 8b. By way of illustration, the charge storage node 1200 in FIG. 12a contains an ORPRO layer. In this example, the ORPRO charge storage node contains an oxide insulating layer 1204, a charge storage silicon rich nitride layer 1206, and a polysilicon layer 1208. The charge storage node 1200 can be formed by any suitable technique. For example, the charge storage node 1200 can be formed in the same manner as described in connection with the formation of the charge storage node 800 in FIGS. 8a and 8b.

FIG. 12a also illustrates forming first bit lines 1210 in the semiconductor substrate 1106 under the bit line openings 1108. The first bit lines 1210 can be formed within the semiconductor substrate 1106 adjacent the charge storage nodes 1200 and under the bit line opening 1108 by any suitable technique. For example, the first bit line 1210 is formed in the same manner as described in connection with the formation of the first bit line 808 in FIG. 8a.

Figure 12B:
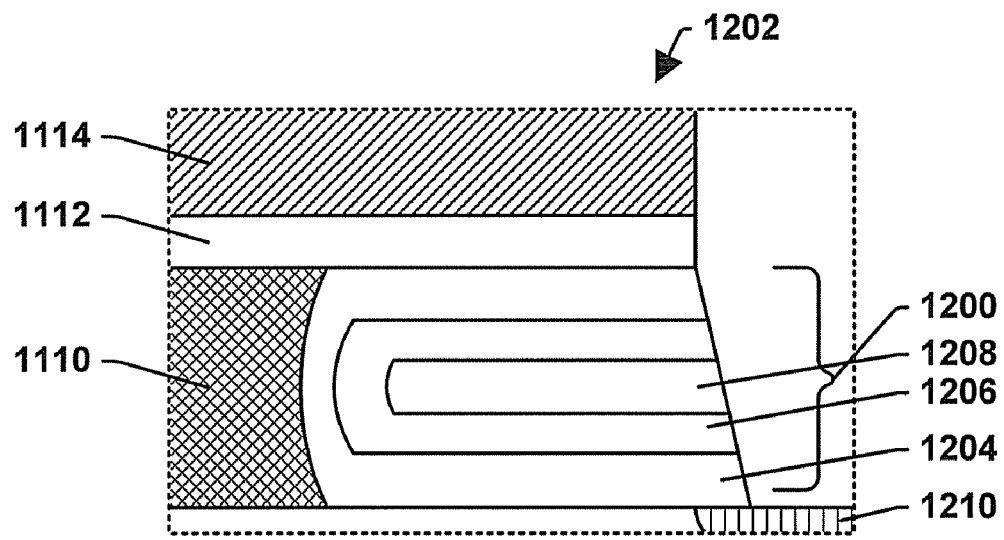

FIG. 12b illustrates an exploded view of an exemplary storage node 1200 indicated by a dashed line 1202 in FIG. 12a. In this example, the storage node 1200 contains an ORPRO layer containing an oxide insulating layer 1204, a charge storage silicon rich nitride layer 1206, and a polysilicon layer 1208.

Figure 13:
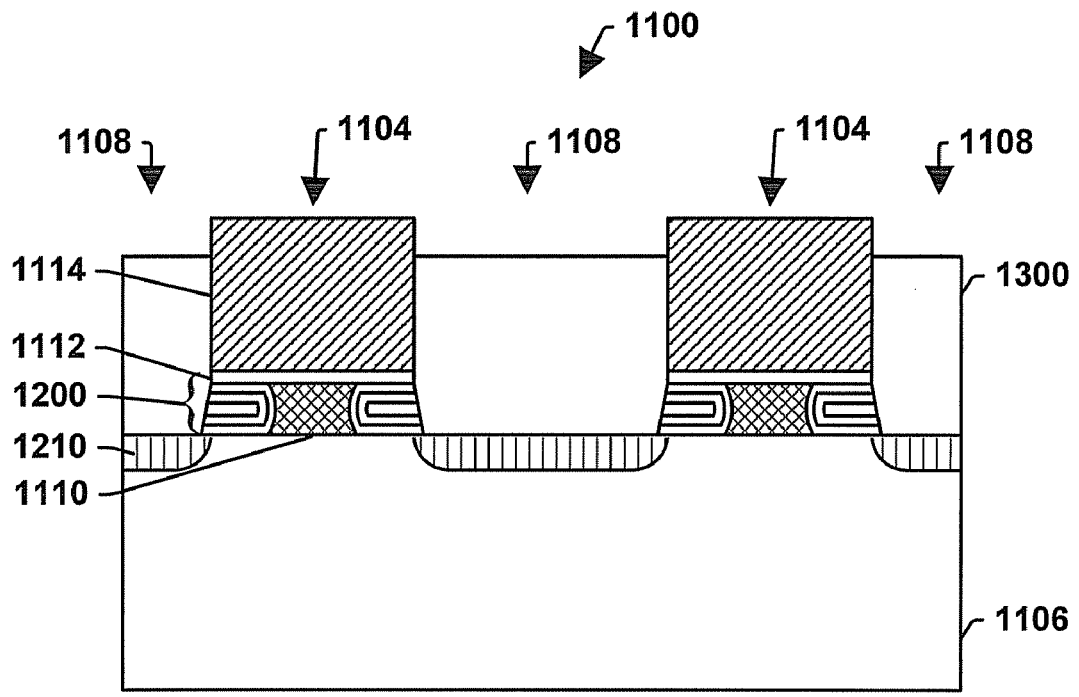

FIG. 13 illustrates forming a bit line dielectric 1300 in the bit line opening 1108. The bit line dielectric 1300 can contain any suitable dielectric material such as oxides. For example, the bit line dielectric 1300 contains any of the materials of the bit line dielectric 900 as described above in connection with FIG. 9. The bit line dielectric 1300 can be formed in the same manner as described in connection with the formation of the bit line dielectric 900 in FIG. 9.

Figure 14:
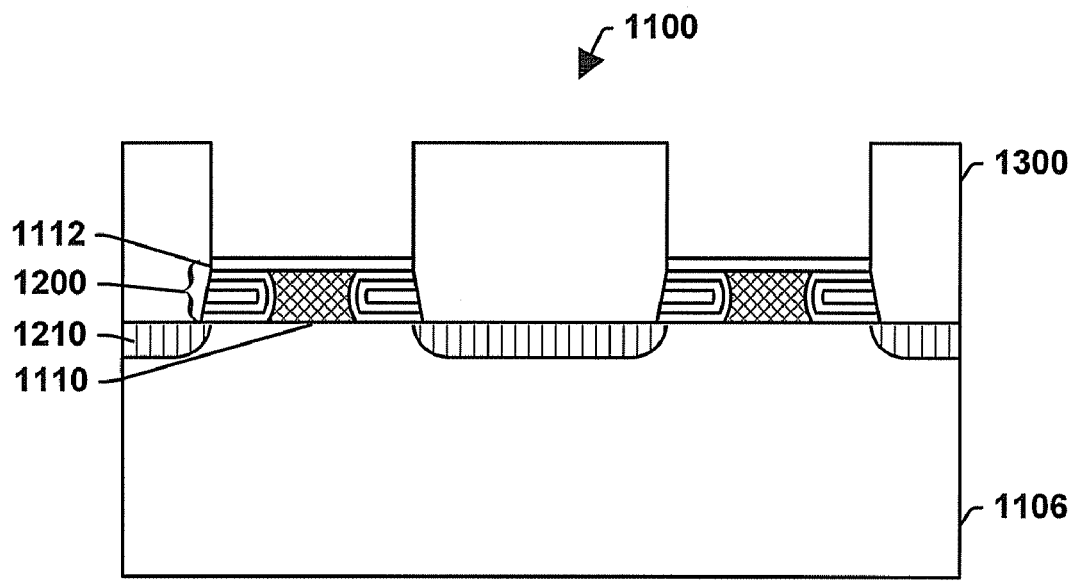

FIG. 14 illustrates removing the first poly 1114 from the memory device 1100, thereby exposing an upper surface of the nitride layer 1112. The first poly 1114 can be removed by, for example, etching. For example, the first poly 1114 can be removed by contacting the first poly 1114 with any suitable poly etchant that does not substantially affect or damage the integrity of other components/layers of the memory device 1100. The poly etching can be dry etching or wet etching. Examples of dry etching include plasma etching, reactive ion etching (RIE), or the like. For example, the plasma etching is performed with chlorinating agents such as $Cl_2$ or a combination of $BCl_3$ and a halogenated hydrocarbon. The poly etch can also be performed with combinations of, for example, $SiCl_4$, $BCl_3$, HBr, $Br_2$, $SF_6$, and $CF_4$. Additives such as $N_2$, $O_2$, Ar, He, or any other noble gas can be included. Other examples of the poly etchants include tetraalkylammonium hydroxides (e.g., tetramethylammonium hydroxide (TMAH)) and alkali metal hydroxides (e.g., a potassium hydroxide (KOH) and cerium hydroxide (CeOH)).

Figure 15A:
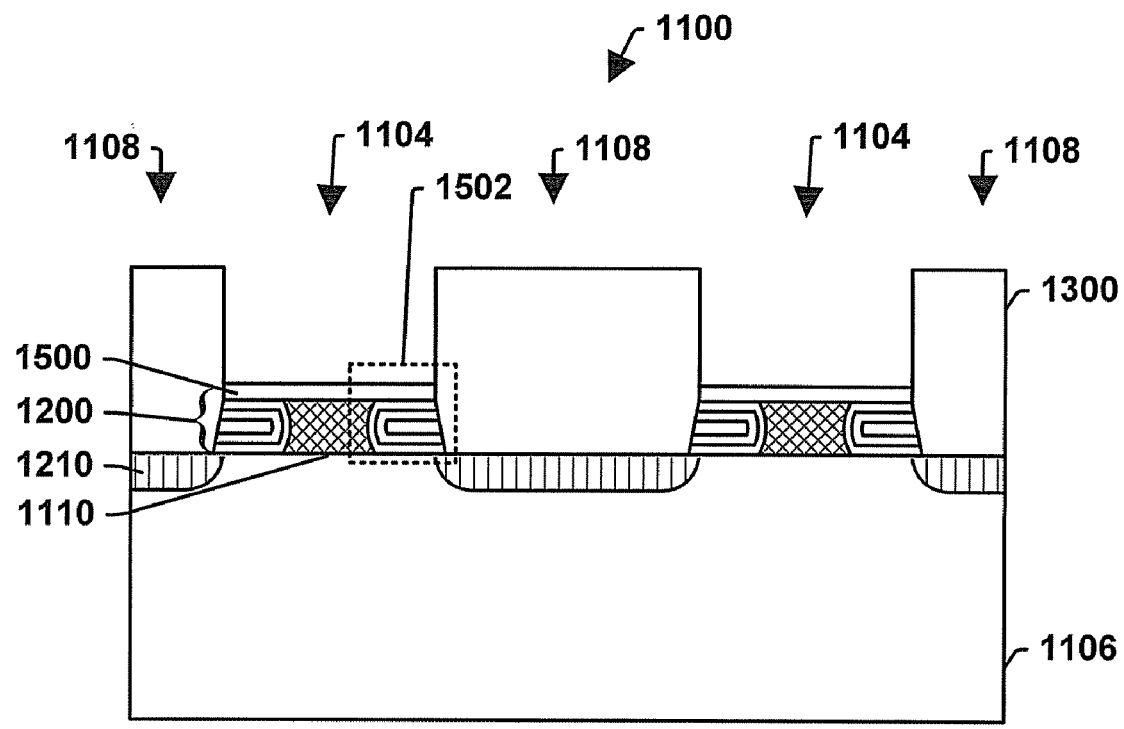

FIG. 15a illustrates converting the nitride layer 1112 to a top oxide layer 1500. The charge storage node 1200 containing the top oxide layer 1500 indicated by a dashed line 1502 is exploded in FIG. 15b. The top oxide layer 1500 can be formed by, for example, oxidizing the nitride layer 1112. The nitride layer 1112 can be oxidized by any suitable technique. For example, the nitride layer 1112 is oxidized in the same manner as described in connection with the oxidation of the nitride layer 508 in FIG. 7a.

The top oxide 1500 is formed by converting the sacrificial nitride layer 1112 to an oxide layer, and not by growing an oxide layer on a surface of a poly layer. As a result, in one embodiment, the method does not involve growing a top oxide on a surface of a poly layer by, for example, oxidizing the poly layer. One advantage of the resulting top oxide layer formed by converting a sacrificial layer is that the oxide layer has substantially uniform height over the semiconductor substrate. In this embodiment, the top oxide 1500 is formed with replacing a first poly gate. In other words, the method involves removing a first poly 1114 to exposed an underlying sacrificial nitride layer 1112, converting the nitride layer 1112 to an oxide layer 1500, and then reforming another poly layer on the oxide layer in a subsequent process.

The height of the top oxide layer 1500 can vary and is not critical to the subject innovation. The top oxide layer 1500 has any suitable height that depends on the desired implementations and/or the memory device 1100 being fabricated. In one embodiment, the height of the top oxide layer 1500 is about 1 nm or more and about 20 nm or less. In another embodiment, the height of the top oxide layer 1500 is about 2 nm or more and about 16 nm or less. In yet another embodiment, the height of the top oxide layer 1500 is about 3 nm or more and about 14 nm or less.

In one embodiment, the surface of the bit line dielectric 1300 is oxidized at the same time that the nitride layer 1112 is oxidized (not shown). For example, when the bit line dielectric 1300 contains materials that can be oxidized, an oxide layer can be formed on the surface of the bit line dielectric 1300. When the bit line dielectric 1300 does not contain materials that can be oxidized, an oxide layer is not formed on the surface of the bit line dielectric by the oxidation.

Figure 15B:
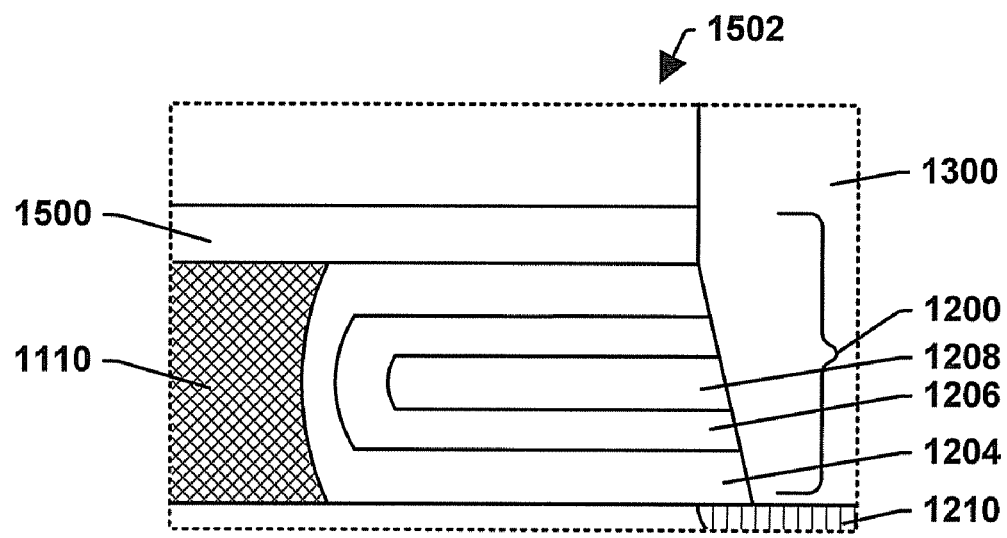

FIG. 15b illustrates an exploded view of an exemplary charge storage node 1200 indicated by a dashed line 1502 in FIG. 15a after converting the nitride layer 1112 to a top oxide layer 1500. When the nitride layer 1112 contains silicon nitride materials (e.g., $Si_3N_4$), the resultant top oxide layer 1500 can contain silicon oxide materials (e.g., $SiO_2$).

Figure 16:
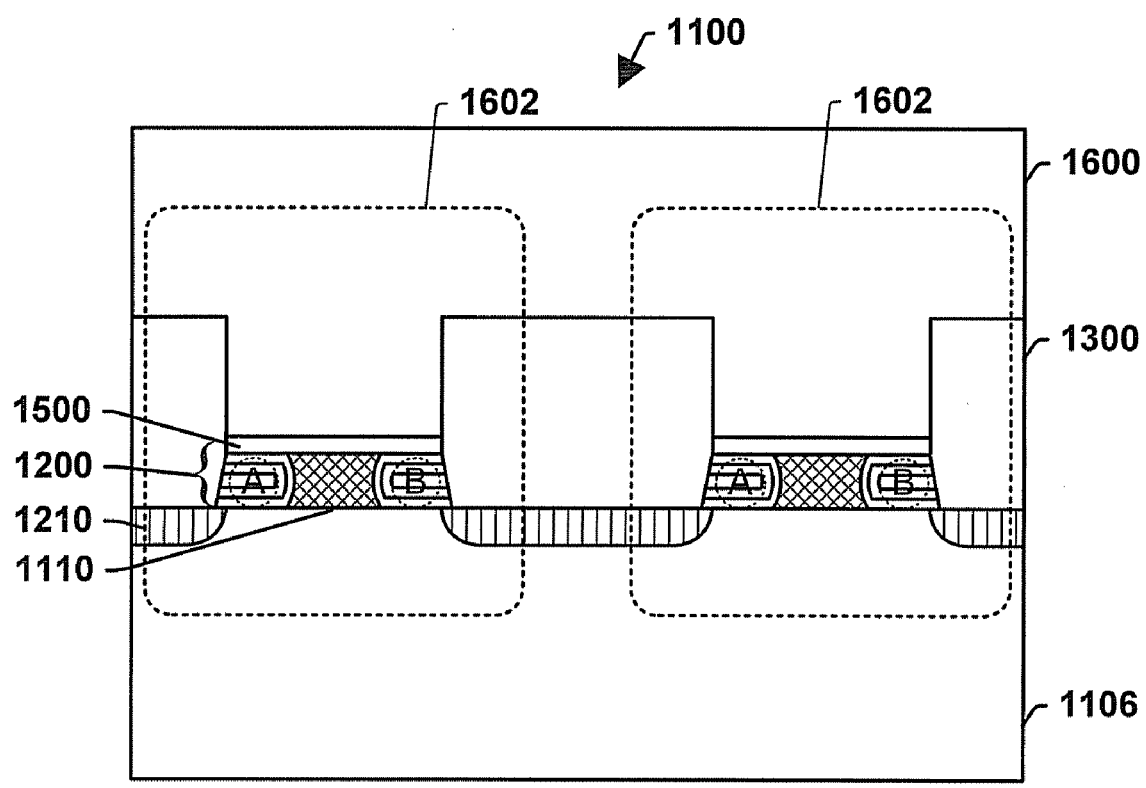

FIG. 16 illustrates forming a second poly 1600 over the semiconductor substrate 1106, thereby forming a memory cell 1602 having improved quality of the top oxide 1500 on the charge storage material layer 1206. The second poly 1600 typically contains polysilicon. The second poly 1600 can be formed over the semiconductor substrate 1106 by, for example, CVD. The second poly 1600 may be a word line of the memory device 1100.

The height of the second poly 1600 may vary and is not critical to the subject innovation. The second poly 1600 can have any suitable height that depends on, for example, the desired implementations and/or the memory device 1100 being fabricated. In one embodiment, the height of the second poly 1600 is about 20 nm or more and 200 nm or less. In another embodiment, the height of the second poly 1600 is about 30 nm or more and 150 nm or less. In yet another embodiment, the height of the second poly 1600 is about 40 nm or more and 100 nm or less. In still yet another embodiment, the height of the second poly 1600 is about 60 nm.

The charge storage nodes 1200 are physically and electrically separated from each other by the dielectric undercut portion 1110. Since the charge storage nodes can store at least a bit of information, respectively, the memory cell 1602 is capable of storing two spatially separated binary data bits, including a left bit represented by the dashed circle A and a right bit represented by the dashed circle B.

Figure 17:
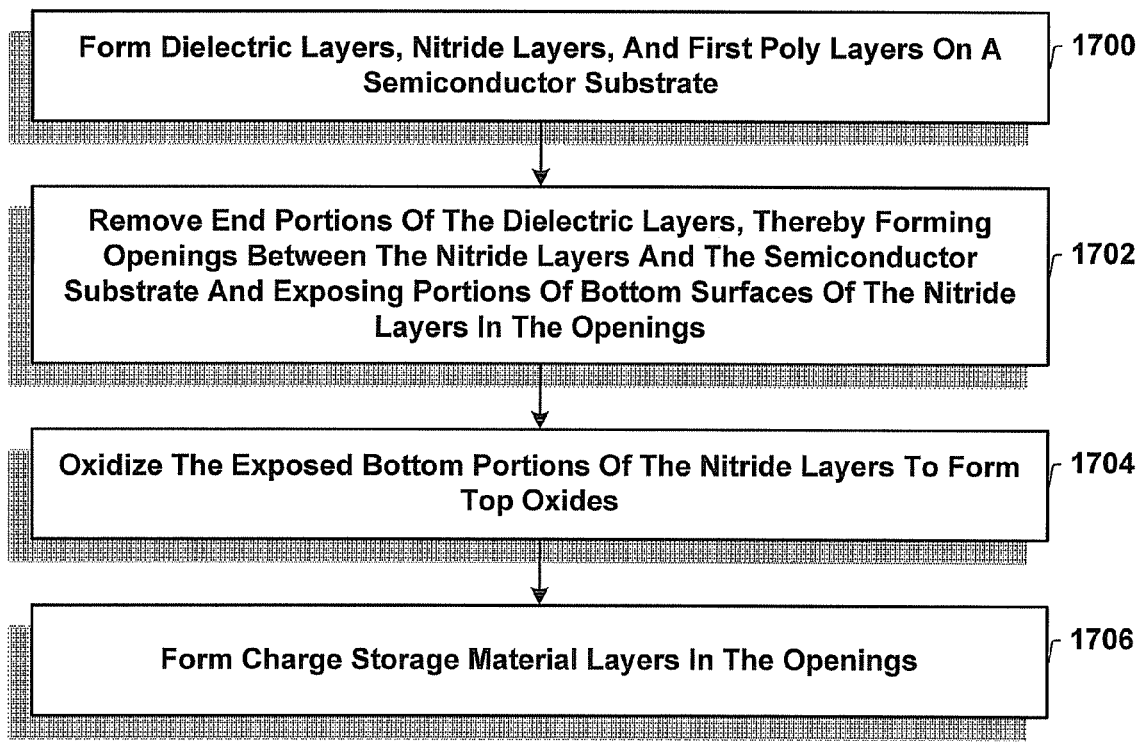
FIGS. 17-19 illustrate exemplary methodologies of forming a top oxide of a memory cell in accordance with other aspects of the subject innovation.

FIG. 17 illustrates an exemplary methodology of forming top oxides of memory cells and/or improving quality of top oxides of memory cells. At 1700, dielectric layers, nitride layers, and first poly layers are formed on a semiconductor substrate. At 1702, end portions of the dielectric layers are removed, thereby forming openings between the nitride layers and the semiconductor substrate and exposing portions of bottom surfaces of the nitride layers in the openings. At 1704, the exposed bottom portions of the nitride layers are oxidized to form top oxides. At 1706, charge storage material layers are formed in the openings.

Figure 18:
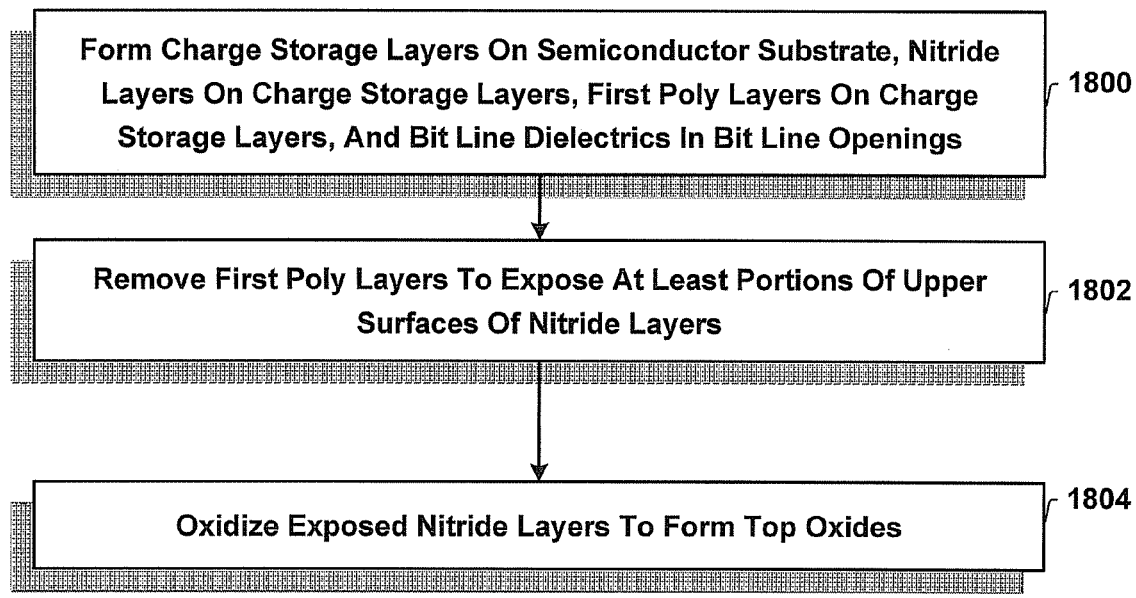

FIG. 18 illustrates another exemplary methodology of forming a memory device containing memory cells and bit line openings therebetween. At 1800, charge storage layers are formed on a semiconductor substrate, nitride layers are formed on the charge storage layers, first poly layers are formed on the charge storage layers, and bit line dielectrics are formed in the bit line openings. At 1802, the first poly layers are removed to expose at least portions of upper surfaces of the nitride layers. At 1804, the exposed nitride layers are oxidized to form top oxides.

Figure 19:
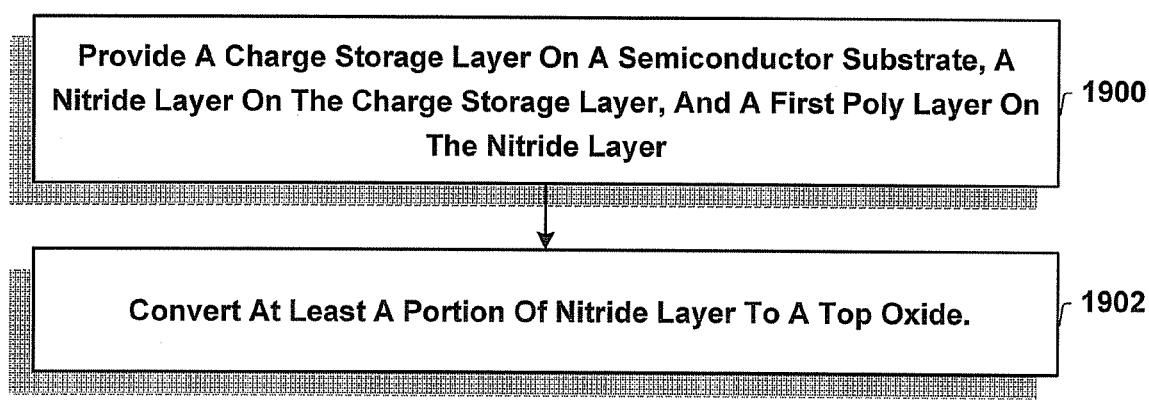

FIG. 19 illustrates yet another exemplary methodology of improving quality of a top oxide of a memory cell. At 1900, a charge storage layer on a semiconductor substrate, a nitride layer on the charge storage layer, and a first poly layer on the nitride layer are provided. At 1902, at least a portion of the nitride layer is converted to a top oxide. In one embodiment, the charge storage layer is provided by forming a dielectric layer on the semiconductor; removing end portions of the dielectric layer and forming openings between the nitride layer and the semiconductor substrate; and forming a charge storage material layer in the opening. In another embodiment, at least a portion of the nitride layer is converted to a top oxide by forming openings under the nitride layer on the semiconductor substrate to expose portions of a bottom surface of the nitride layer; and oxidizing the exposed portions of the bottom surface of the nitride layer. In yet another embodiment, at least of the nitride layer is converted to a top oxide by removing the first poly layer to expose an upper portions of the nitride layer; and oxidizing the exposed upper portions of the nitride layer.

Although not shown, the methodologies of FIGS. 17-19 can include any suitable semiconductor structure fabrication processes. General examples of semiconductor structure fabrication processes include masking, patterning, etching, cleaning, planarization, thermal oxidation, implant, annealing, thermal treatment, and deposition techniques normally used for malting semiconductor structures.

The resultant memory devices formed herein can be any suitable memory devices. Examples of memory devices include volatile memories and non-volatile memories. Examples of volatile memories include RAM such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), Rambus dynamic RAM (RDRAM), or the like. Examples of non-volatile memories include ROM, PROM, electrically programmable ROM (EPROM), electrically erasable programmable ROM (EEPROM), flash memory, or the like. The memory device also can be employed for central processing units (CPUs), input/output devices (I/O chips), or the like.

The resultant memory devices formed herein are useful in any electronic device. For example, the resultant memory devices are useful in computers, appliances, industrial equipment, hand-held devices, telecommunications equipment, medical equipment, research and development equipment, transportation vehicles, radar/satellite devices, or the like. Hand-held devices, and particularly hand-held electronic devices can achieve improvements in portability due to the quality, small size, lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, or the like.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications and variations that fall within the spirit and scope of the appended claims. Furthermore, to the extent that the term "contain," "includes," and "involves" are used in either the detailed description or the claims, such terms are intended to be inclusive in a manner similar to the term "comprising" as "comprising" is interpreted when employed as a transitional word in a claim.

What is claimed is:

1. A method of forming top oxides of memory cells, comprising:
    forming dielectric layers on a semiconductor substrate, forming sacrificial nitride layers only over the dielectric layers, and forming first poly layers over the nitride layers;
    removing end portions of the dielectric layers thereby forming openings between the sacrificial nitride layers and the semiconductor substrate and exposing portions of bottom surfaces of the sacrificial nitride layers in the openings;
    oxidizing the exposed bottom surfaces of the sacrificial nitride layers to form top oxides; and
    then forming charge storage material layers in the openings.

2. The method of claim 1 further comprising forming bit line dielectrics in bit line openings on the semiconductor substrate between the first poly layers.

3. The method of claim 1 further comprising forming a second poly layer over the semiconductor substrate.

4. The method of claim 1, wherein oxidizing the at least portions of the nitride layers comprises a slot plane antenna process.

5. The method of claim 1, wherein the nitride layers comprise silicon nitrides.

6. The method of claim 1, wherein the memory cell comprises two charge storage nodes that are separated from each other by the dielectric layers.

7. The method of claim 1, wherein the two charge storage nodes comprise a ORPRO layer.

8. The method of claim 1 further comprising entirely oxidizing the nitride layers to convert the nitride layers into top oxide layers.

9. The method of claim 1 further comprising:
    oxidizing exposed portions or the dielectric layers and the semiconductor substrate in the openings.

10. A method of improving quality of a top oxide of a memory cell, comprising:
    providing a charge storage layer on a semiconductor substrate, providing a sacrificial nitride layer, and providing a first poly layer on the sacrificial nitride layer, and converting the sacrificial nitride layer to a top oxide, wherein providing the charge storage layer comprises:
    forming a dielectric layer on the semiconductor, forming a sacrificial nitride layer only on the dielectric layer, removing end portions of the dielectric layer and forming openings between the sacrificial nitride layer and the semiconductor substrate, and then forming a charge storage material layer in the opening; and
    wherein converting the sacrificial nitride layer to a top oxide comprises:
    forming openings under the sacrificial nitride layer on the semiconductor substrate to expose portions of a bottom surface of the sacrificial nitride layer; and oxidizing the exposed portions of the bottom surface of the sacrificial nitride layer.

11. The method of claim 10, wherein converting the nitride layer to a top oxide comprises:
    removing the first poly layer to expose an upper portions of the nitride layer; and
    oxidizing the exposed portions of the upper surface of the nitride layer.

12. The method of claim 10 further comprising forming bit line dielectrics in bit line openings between the first poly layers.

13. The method of claim 10 further comprising forming a second poly layer or a word line over the semiconductor substrate.

14. The method of claim 10, wherein converting the nitride layer comprises a slot plane antenna process.

15. A method of forming top oxides of memory cells, comprising:
    forming dielectric layers on a semiconductor substrate, forming sacrificial nitride layers only over the dielectric layers, and forming first poly layers over the sacrificial nitride layers;
    removing end portions of the dielectric layers thereby forming openings between the sacrificial nitride layers and the semiconductor substrate and exposing portions of bottom surfaces of the sacrificial nitride layers, portions of the dielectric layers and portions of the semiconductor substrate in the openings;
    forming an oxide layer over the exposed portions of the bottom surfaces of the sacrificial nitride layers, the exposed portions of the dielectric layers, and the exposed portions of the semiconductor substrate in the openings; and
    then forming charge storage material layers in the openings.

16. The method of claim 15, wherein the forming the oxide layer includes oxidizing the exposed portions of the bottom surfaces of the nitride layers, the exposed portions of the dielectric layers, and the exposed portions of the semiconductor substrate in the openings.

17. The method of claim 15, wherein the forming the oxide layer includes depositing oxide materials on the exposed portions of the bottom surfaces of the nitride layers, the exposed portions of the dielectric layers, and the exposed portions of the semiconductor substrate in the openings.

18. The method of claim 15, wherein the forming the oxide layer over the exposed portions of the bottom surfaces of the nitride layers includes entirely oxidizing the nitride layers to convert the nitride layers into top oxide layers.

* * * * *